United States Patent
Moue et al.

(10) Patent No.: US 11,418,749 B2
(45) Date of Patent: Aug. 16, 2022

(54) SOLID-STATE IMAGE PICK-UP DEVICE AND ELECTRONIC DEVICE

(71) Applicant: SONY SEMICONDUCTOR SOLUTIONS CORPORATION, Kanagawa (JP)

(72) Inventors: Takashi Moue, Kanagawa (JP); Yosuke Ueno, Kanagawa (JP); Tomonori Yamashita, Kanagawa (JP); Kazunori Hasebe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 93 days.

(21) Appl. No.: 16/647,048

(22) PCT Filed: Sep. 4, 2018

(86) PCT No.: PCT/JP2018/032757
§ 371 (c)(1),
(2) Date: Mar. 13, 2020

(87) PCT Pub. No.: WO2019/058959
PCT Pub. Date: Mar. 28, 2019

(65) Prior Publication Data
US 2020/0260034 A1   Aug. 13, 2020

(30) Foreign Application Priority Data

Sep. 22, 2017 (JP) ................................ 2017-182192

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14603* (2013.01); *H01L 27/14609* (2013.01); *H04N 5/374* (2013.01)

(58) Field of Classification Search
CPC ........ H04N 5/378; H04N 5/374; H04N 5/379; H01L 27/14603; H01L 27/14609; H01L 27/14634
See application file for complete search history.

(56) References Cited

U.S. PATENT DOCUMENTS 5,757,440 A * 5/1998 Mangelsdorf ............ H04N 5/18
340/573.4
2002/0179821 A1* 12/2002 Aibara ................... H04N 5/357
250/214 A
(Continued)

FOREIGN PATENT DOCUMENTS

JP   2010-034616 A   2/2010
JP   2013-078153 A   4/2013
(Continued)

OTHER PUBLICATIONS

International Search Report and Written Opinion of PCT Application No. PCT/JP2018/032757, dated Oct. 16, 2018, 11 pages of ISRWO.

*Primary Examiner* — Albert H Cutler
(74) *Attorney, Agent, or Firm* — Chip Law Group

(57) ABSTRACT

A solid-state image pick-up device of the present disclosure includes a pixel array unit obtained by disposing a plurality of unit pixels, each of which includes a photoelectric conversion unit, in a matrix form, an amplifier unit that adjusts a level of a pixel signal output from a unit pixel through a vertical signal line provided to correspond to column arrangement of the pixel array unit, a sample and hold unit that samples and holds a pixel signal passing through the amplifier unit, and an analog-digital conversion unit that converts the pixel signal output from the sample and hold unit into a digital signal. Further, the sample and hold unit includes at least three capacitors that hold pixel signals and performs fetching of a pixel signal to one capacitor and outputting of an image signal fetched to another capacitor in advance to the analog-digital conversion unit in parallel.

9 Claims, 19 Drawing Sheets

(51) Int. Cl.
  *H04N 5/374* (2011.01)
  *H04N 5/369* (2011.01)

(56) References Cited

U.S. PATENT DOCUMENTS

| | | | |
|---|---|---|---|
| 2009/0184237 A1* | 7/2009 | Suzuki | H01L 27/14663 |
| | | | 250/208.1 |
| 2010/0020217 A1 | 1/2010 | Abe et al. | |
| 2013/0162874 A1* | 6/2013 | Hashimoto | H04N 5/378 |
| | | | 348/300 |
| 2013/0222631 A1 | 8/2013 | Iwane et al. | |
| 2013/0229560 A1* | 9/2013 | Kondo | H04N 5/37452 |
| | | | 348/308 |
| 2014/0098269 A1 | 4/2014 | Saito et al. | |
| 2015/0124138 A1* | 5/2015 | Ueda | H04N 5/376 |
| | | | 348/308 |
| 2015/0373277 A1* | 12/2015 | Canniff | H04N 5/2355 |
| | | | 348/230.1 |
| 2016/0198114 A1* | 7/2016 | Zhang | H04N 5/3575 |
| | | | 348/245 |
| 2018/0184026 A1 | 6/2018 | Kato et al. | |

FOREIGN PATENT DOCUMENTS

| | | |
|---|---|---|
| JP | 2013-183216 A | 9/2013 |
| JP | 2014-075750 A | 4/2014 |
| WO | 2017/056248 A1 | 4/2017 |

\* cited by examiner

SOLID-STATE IMAGE PICK-UP DEVICE AND ELECTRONIC DEVICE

CROSS REFERENCE TO RELATED APPLICATIONS

This application is a U.S. National Phase of International Patent Application No. PCT/JP2018/032757 filed on Sep. 4, 2018, which claims priority benefit of Japanese Patent Application No. JP 2017-182192 filed in the Japan Patent Office on Sep. 22, 2017. Each of the above-referenced applications is hereby incorporated herein by reference in its entirety.

TECHNICAL FIELD

The present disclosure relates to a solid-state image pick-up device and an electronic device.

BACKGROUND ART

In a solid-state image pick-up device, for example, a single slope type analog-digital converter can be used as an analog-digital converter of an analog-digital conversion unit that converts an analog pixel signal output from a unit pixel into a digital signal. In the single slope type analog-digital converter, when a pixel signal reading and analog-digital conversion time for one time is set to one AD time, most of one AD time is occupied by a settling time of an input signal from a unit pixel and a count time of a counter of the analog-digital converter.

Conventionally, a column amplifier unit having an adaptive gain control or automatic gain control (AGC) function is disposed in front of the analog-digital conversion unit to shorten one AD time (for example, see Non-Patent Document 1). In a conventional technology described in Non-Patent Document 1, since a final resolution can be maintained even when a resolution of the analog-digital conversion unit is lowered, the resolution of the analog-digital conversion unit can be lowered. Therefore, in the single slope type analog-digital converter, particularly, a count time of a signal level can be shortened, and thus one AD time can be shortened.

CITATION LIST

Non-Patent Document

Non-Patent Document 1: An APS-H-Size 250 Mpixel CMOS image sensor using column single-slope ADCs with dual-gain amplifiers. ISSCC 2016

SUMMARY OF THE INVENTION

Problems to be Solved by the Invention

In a configuration in which the column amplifier unit is disposed in front of the analog-digital conversion unit described above, after settling is completed, an output voltage of the column amplifier unit and an output voltage of the unit pixel need to continuously keep constant values during analog-digital conversion, and thus an output from a subsequent unit pixel needs to wait for completion of analog-digital conversion. Meanwhile, the analog-digital conversion unit needs to wait for a start of analog-digital conversion until settling is completed. Therefore, even though the conventional technology described in Non-Patent Document 1 can shorten one AD time, the amount of reduction of one AD time is limited due to the remaining count time and settling time.

Therefore, an object of the present disclosure is to provide a solid-state image pick-up device capable of shortening a substantial pixel signal reading time including analog-digital conversion, and an electronic device having the solid-state image pick-up device.

Solutions to Problems

A solid-state image pick-up device of the present disclosure for achieving the above object includes
a pixel array unit obtained by disposing a plurality of unit pixels, each of which includes a photoelectric conversion unit, in a matrix form,
an amplifier unit that adjusts a level of a pixel signal output from a unit pixel through a vertical signal line provided to correspond to column arrangement of the pixel array unit,
a sample and hold unit that samples and holds a pixel signal passing through the amplifier unit, and
an analog-digital conversion unit that converts the pixel signal output from the sample and hold unit into a digital signal,
in which the sample and hold unit includes at least three capacitors that hold pixel signals and performs fetching of a pixel signal to one capacitor and outputting of an image signal fetched to another capacitor to the analog-digital conversion unit in parallel.

In addition, an electronic device according to the present disclosure for achieving the above object includes the solid-state image pick-up device having the above configuration.

In the solid-state image pick-up device or electronic device having the above-described configuration, the sample and hold unit provided between the amplifier unit and the analog-digital conversion unit can temporarily hold the pixel signal passing through the amplifier unit. In this way, after settling is completed, the output voltage of the amplifier unit is held in the capacity of the sample and hold unit, while the amplifier unit can immediately shift to subsequent input signal fetching and settling. Then, while the amplifier unit fetches the subsequent input signal, the analog-digital conversion unit performs analog-digital conversion on the voltage signal held in the sample and hold unit. In this way, settling and analog-digital conversion are performed in parallel.

Effects of the Invention

According to the present disclosure, effective one AD time can be shortened by performing settling and analog-digital conversion in parallel, and thus it is possible to shorten a substantial pixel signal reading time including analog-digital conversion.

Note that effects described here are not necessarily limited, and any of the effects described in the present specification may be adopted. Moreover, the effects described in the present specification are merely examples, and the invention is not limited thereto. In addition, an additional effect may be present.

MODE FOR CARRYING OUT THE INVENTION

Figure 1:
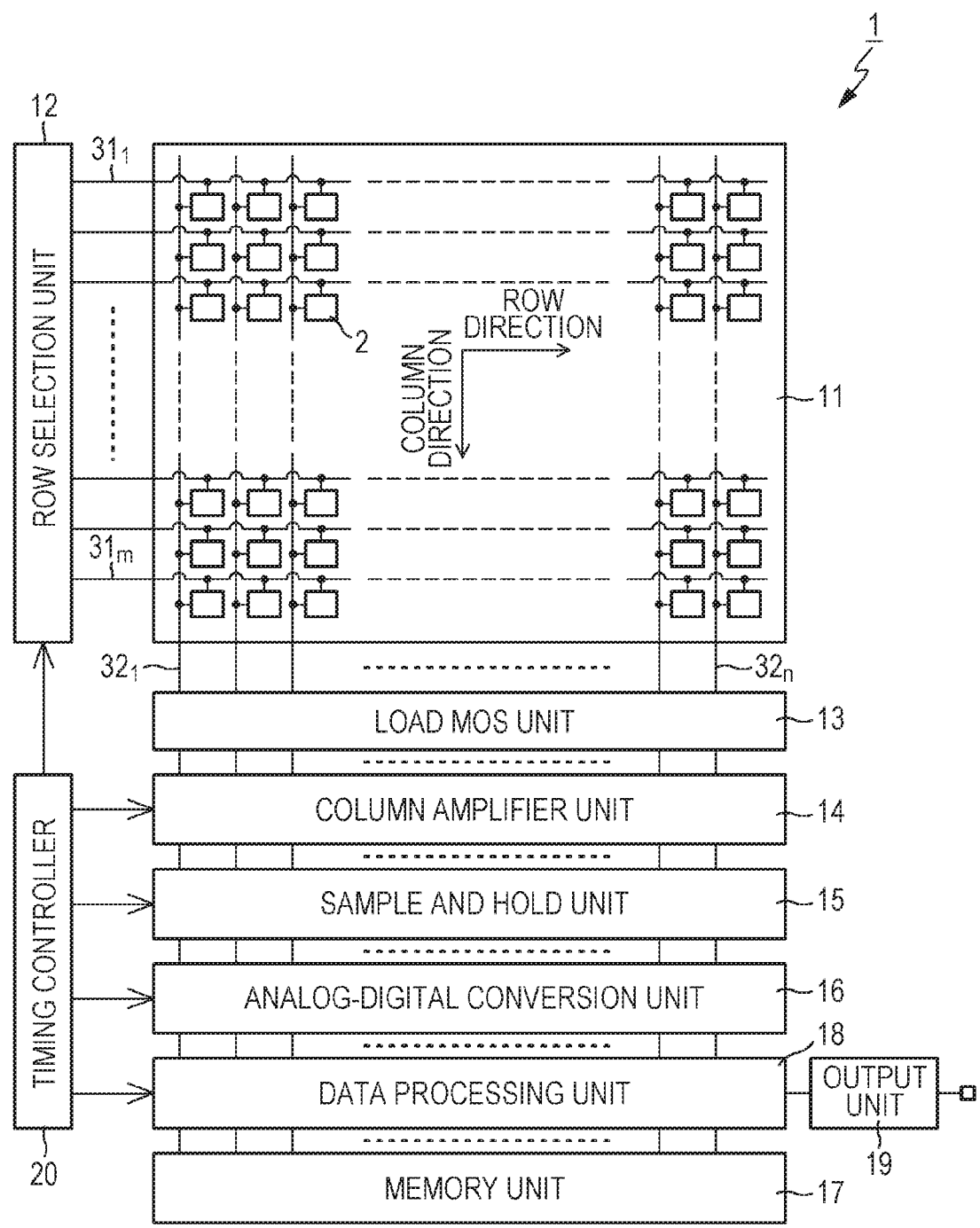
FIG. 1 is a block diagram illustrating an outline of a basic configuration of a CMOS image sensor according to an embodiment of the present disclosure.

Hereinafter, modes for carrying out the technology of the present disclosure (hereinafter referred to as "embodiments") will be described in detail with reference to the drawings. The technology of the present disclosure is not limited to the embodiments, and various numerical values, etc. in the embodiments are examples. In the following description, the same reference numerals are used for the same elements or elements having the same function, and redundant description is omitted. Note that the description will be given in the following order.

1. Overall description of solid-state image pick-up device and electronic device of present disclosure
2. Solid-state image pick-up device of present disclosure
2-1. Basic configuration
2-2. Circuit configuration of unit pixel
2-3. Stacked structure
2-4. With regard to one AD time
2-4-1. Circuit configuration not having column amplifier unit
2-4-2. Circuit configuration having column amplifier unit
2-5. With regard to sample and hold unit
2-5-1. Example 1 (Example of having four capacitors for holding pixel signals)
2-5-2. Example 2 (Modification of Example 1: Example in which inverting amplifier includes P-type MOS input source grounded operational amplifier)
2-5-3. Example 3 (Modification of Example 1: Example of using input of inverting amplifier as input of level determination circuit)
2-5-4. Example 4 (Modification of Example 1: Example in which capacitance value of feedback capacitor of column amplifier unit is set to be variable)
2-5-5. Example 5 (Modification of Example 1: Example of having plurality of level determination circuits)
2-5-6. Example 6 (Example of having three capacitors for holding pixel signals)
2-6. Modification of embodiment
2-7. Application example of embodiment
3. Application examples of technology of present disclosure
3-1. Electronic device of present disclosure (Example of image pick-up device)
3-2. Example of application to moving body
4. Configuration that can be taken by present disclosure <Overall Description of Solid-State Image Pick-Up Device and Electronic Device of Present Disclosure>

In a solid-state image pick-up device and an electronic device of the present disclosure, it is possible to adopt a configuration having a stacked structure in which at least two semiconductor substrates of a first semiconductor substrate and a second semiconductor substrate are stacked. Further, in this stacked structure, a pixel array unit is preferably formed on the first semiconductor substrate, and a sample and hold unit is preferably formed on a semiconductor substrate other than the first semiconductor substrate, for example, the second semiconductor substrate.

In the solid-state image pick-up device and the electronic device of the present disclosure including the preferable configuration described above, a pixel signal includes a reset signal output from a unit pixel during resetting and a data signal output from the unit pixel during photoelectric conversion. Further, the sample and hold unit may adopt a configuration having a total of four capacities corresponding to two capacities for a reset signal and a data signal of one pixel signal and two capacities for a reset signal and a data signal of the other image signal with respect to two pixel signals output from the unit pixel one after another in time series.

Moreover, in the solid-state image pick-up device and the electronic device of the present disclosure including the preferable configuration described above, the sample and hold unit may have a configuration including a reset switch that resets a potential of a circuit output terminal that outputs a pixel signal to an analog-digital conversion unit.

Furthermore, in the solid-state image pick-up device and the electronic device of the present disclosure including the preferable configuration described above, an amplifier unit may have a configuration including an adaptive gain type amplifier that adaptively adjusts gain to obtain a constant signal level. Further, the amplifier unit may have a configuration capable of switching at least two types of gains. In addition, the amplifier unit may have a configuration including a level determination circuit that determines a level of a pixel signal to switch gain according to a determination result of the level determination circuit.

In addition, in the solid-state image pick-up device and the electronic device of the present disclosure including the preferable configuration described above, it is possible to adopt a configuration including a digital signal processing unit that processes a digital signal output from the analog-digital conversion unit. Further, in the digital signal processing unit, it is possible to adopt a configuration in which level adjustment, specifically, compression processing is performed on a digital signal on the basis of a determination result of the level determination circuit.

<Solid-State Image Pick-Up Device of Present Disclosure>

[Basic Configuration]

First, a description will be given of a basic configuration of the solid-state image pick-up device of the present disclosure. In the present embodiment, a complementary metal oxide semiconductor (CMOS) image sensor, which is a type of X-Y address type solid-state image pick-up device, will be described as an example of the solid-state image pick-up device. The CMOS image sensor is an image sensor fabricated by applying or partially using a CMOS process.

FIG. 1 is a block diagram illustrating an outline of a basic configuration of a CMOS image sensor according to an embodiment of the present disclosure. A CMOS image sensor 1 according to the present embodiment has a configuration including a pixel array unit 11 obtained by two-dimensionally disposing unit pixels (hereinafter simply referred to as "pixels" in some cases) 2, each of which includes a photoelectric conversion unit, in a row direction and a column direction, that is, in a matrix form and a peripheral circuit portion of the pixel array unit 11. Here, the row direction refers to an arrangement direction (so-called horizontal direction) of the unit pixels 2 in a pixel row, and the column direction refers to an arrangement direction (so-called vertical direction) of the unit pixels 2 in a pixel column. Each of the unit pixels 2 generates and accumulates photocharges according to a received light quantity by performing photoelectric conversion.

The peripheral circuit portion of the pixel array unit 11 includes, for example, a row selection unit 12, a load MOS unit 13, a column amplifier unit 14, a sample and hold unit 15, an analog-digital conversion unit 16, a memory unit 17, a data processing unit 18, an output unit 19, a timing controller 20, etc.

In the pixel array unit 11, for a matrix-like pixel array, pixel drive lines 31 ($31_1$ to $31_m$) are wired along the row direction for respective pixel rows, and vertical signal lines ($32_1$ to $32_n$) are wired along the column direction for respective pixel columns. The pixel drive line 31 transmits a drive signal for performing driving when a signal is read from the unit pixel 2. In FIG. 1, the pixel drive line 31 is illustrated as one wiring. However, the number is not limited to one. One end of the pixel drive line 31 is connected to an output end corresponding to each row of the row selection unit 12.

Hereinafter, a description will be given of respective circuit units of the peripheral circuit portion of the pixel array unit 11, that is, the row selection unit 12, the load MOS unit 13, the column amplifier unit 14, the sample and hold unit 15, the analog-digital conversion unit 16, the memory unit 17, the data processing unit 18, the output unit 19, and the timing controller 20.

The row selection unit 12 includes a shift register, an address decoder, etc., and drives each pixel 2 of the pixel array unit 11 at the same time, in units of rows, or the like. That is, the row selection unit 12 is included in a drive unit that drives each pixel 2 of the pixel array unit 11 together with the timing controller 20 that controls the row selection unit 12. A specific configuration of the row selection unit 12 is not illustrated. However, in general, the row selection unit 12 has two scanning systems corresponding to a reading scanning system and a sweep scanning system.

To read pixel signals from the unit pixels 2, the reading scanning system selectively scans the unit pixels 2 of the pixel array unit 11 successively in units of rows. The pixel signal read from the unit pixel 2 is an analog signal. The sweep scanning system performs sweep scanning on a read row on which reading scanning is performed by the reading scanning system prior to the reading scanning by a time corresponding to a shutter speed.

By the sweep scanning using the sweep scanning system, unnecessary charges are swept out from the photoelectric conversion unit of the unit pixel 2 in the read row, thereby resetting the photoelectric conversion unit. Then, a so-called electronic shutter operation is performed by sweeping (resetting) unnecessary charges by the sweep scanning system. Here, the electronic shutter operation refers to an operation in which the photocharges of the photoelectric conversion unit are discarded and exposure is newly started (photocharge accumulation is started).

A signal read by a read operation by the reading scanning system corresponds to the amount of light received after the immediately preceding read operation or electronic shutter operation. Further, a period from a read timing by the immediately preceding read operation or a sweep timing by the electronic shutter operation to a read timing by a current read operation becomes a photocharge exposure period in the unit pixel 2.

The load MOS unit 13 includes a set of current sources I having MOS transistors connected to the respective vertical signal lines 32 ($32_1$ to $32_n$) for the respective pixel columns (see FIG. 2), and a bias current is supplied through each of the vertical signal lines 32 to each pixel 2 of a pixel row selectively scanned by the row selection unit 12.

The column amplifier unit 14 includes an adaptive gain type amplifier having an adaptive gain control or automatic gain control (AGC) function for adaptively adjusting the gain to obtain a constant signal level. The column amplifier unit 14 adjusts a level of a pixel signal read from each pixel 2 of the pixel row selectively scanned by the row selection unit 12 and output through each of the vertical signal lines 32 ($32_1$ to $32_n$). Details of the column amplifier unit 14 will be described later.

The sample and hold unit 15 samples and holds the pixel signal output from the column amplifier unit 14. The technology of the present disclosure is applied to the sample and hold unit 15. The sample and hold unit 15 to which the technology of the present disclosure is applied has at least three capacitors for holding pixel signals and performs fetching of a pixel signal to one capacitor and outputting of an image signal fetched to another capacity to a subsequent stage in parallel. Details of the sample and hold unit 15 will be described later.

The analog-digital conversion unit 16 includes a set of a plurality of analog-digital converters provided corresponding to the vertical signal lines 32 ($32_1$ to $32_n$), and converts an analog pixel signal output from the sample and hold unit 15 for each pixel column into a digital signal. A well-known analog-digital converter may be used as the analog-digital converter. Specifically, examples of the analog-digital converter may include a single slope type analog-digital converter, a successive approximation type analog-digital converter, or a delta-sigma modulation type ($\Delta\Sigma$ modulation type) analog-digital converter. However, the analog-digital converter is not limited thereto.

The memory unit 17 stores an analog-digital conversion result in the analog-digital conversion unit 16 under processing by the data processing unit 18.

The data processing unit 18 is a digital signal processing unit that processes a digital signal output from the analog-digital conversion unit 16, and performs a process of writing/reading an analog-digital conversion result to/from the memory unit 17 or performs various processes on the analog-digital conversion result. Further, the data processing unit 18 performs level adjustment on the digital signal on the basis of a level determination result of the level determination circuit 142 (see FIG. 6) described later of the column amplifier unit 14.

The output unit 19 outputs a signal after processing by the data processing unit 18. The timing controller 20 generates various timing signals, clock signals, control signals, etc., and performs drive control on the row selection unit 12, the column amplifier unit 14, the sample and hold unit 15, the analog-digital conversion unit 16, the data processing unit 18, etc. on the basis of the generated signals.

[Circuit Configuration of Unit Pixel]

Figure 2:
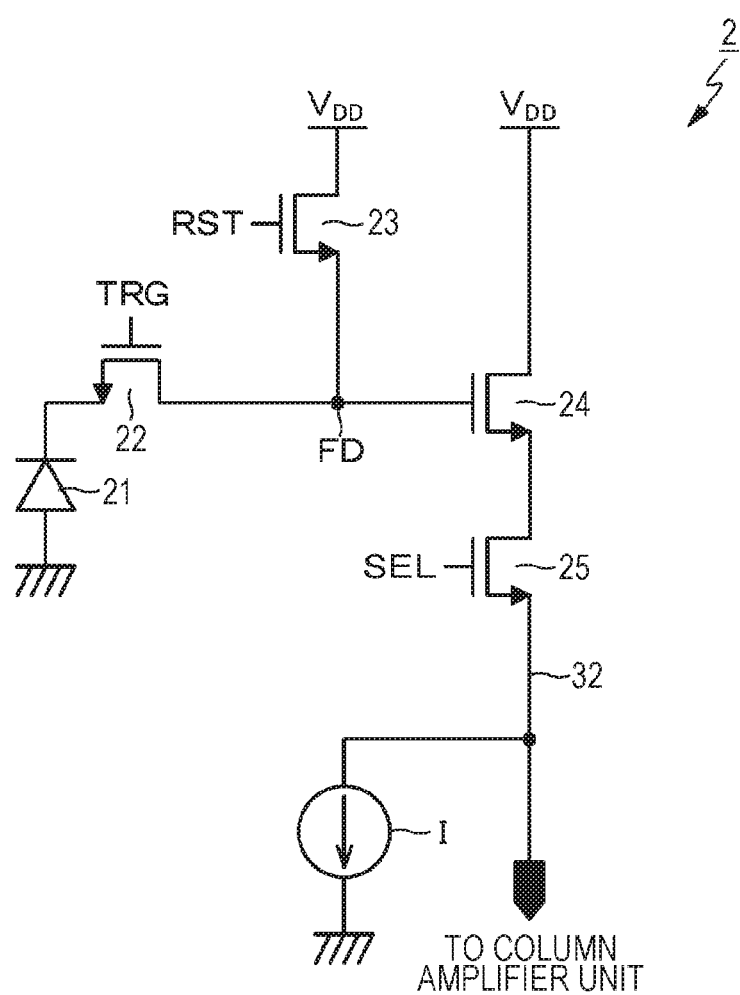
FIG. 2 is a circuit diagram illustrating an example of a circuit configuration of a unit pixel.

FIG. 2 is a circuit diagram illustrating an example of a circuit configuration of the unit pixel 2. The unit pixel 2 includes, for example, a photodiode 21 as a photoelectric conversion unit. The unit pixel 2 has a pixel configuration including a transfer transistor 22, a reset transistor 23, an amplification transistor 24, and a selection transistor 25 in addition to the photodiode 21.

Note that, here, for example, N-type MOSFETs are used as the four transistors of the transfer transistor 22, the reset transistor 23, the amplification transistor 24, and the selection transistor 25. However, a combination of conductivity types of the four transistors 22 to 25 illustrated here is merely an example, and the invention is not limited to the combination.

For this unit pixel 2, a plurality of pixel drive lines is wired in common to each pixel 2 in the same pixel row as the pixel drive lines 31 ($31_1$ to $31_m$) described above. The plurality of pixel drive lines is connected to output ends corresponding to respective pixel rows of the row selection unit 12 in units of pixel rows. The row selection unit 12 appropriately outputs a transfer signal TRG, a reset signal RST, and a selection signal SEL to the plurality of pixel drive lines.

The photodiode 21 has an anode electrode connected to a low-potential-side power source (for example, ground), and photoelectrically converts received light into photocharges (here, photoelectrons) having a charge amount corresponding to the amount of light and accumulates the photocharges. A cathode electrode of the photodiode 21 is electrically connected to a gate electrode of the amplification transistor 24 through the transfer transistor 22. Here, a region where the gate electrode of the amplification transistor 24 is electrically connected is a floating diffusion (floating diffusion region/impurity diffusion region) FD. The floating diffusion FD is a charge-voltage conversion unit that converts charge into voltage.

A transfer signal TRG that activates a high level (for example, $V_{DD}$ level) is supplied from the row selection unit 12 to a gate electrode of the transfer transistor 22. The transfer transistor 22 becomes conductive in response to the transfer signal TRG, thereby transferring the photocharges photoelectrically converted by the photodiode 21 and accumulated in the photodiode 21 to the floating diffusion FD.

The reset transistor 23 is connected between a node of a high-potential-side power source $V_{DD}$ and the floating diffusion FD. A reset signal RST that activates a high level is supplied from the row selection unit 12 to a gate electrode of the reset transistor 23. The reset transistor 23 becomes conductive in response to the reset signal RST, and resets the floating diffusion FD by discarding a charge of the floating diffusion FD to a node of the voltage $V_{DD}$.

The amplification transistor 24 has a gate electrode connected to the floating diffusion FD and a drain electrode connected to a node of the high-potential-side power source $V_{DD}$. The amplification transistor 24 serves as an input unit of a source follower that reads a signal obtained by photoelectric conversion in the photodiode 21. That is, a source electrode of the amplification transistor 24 is connected to the vertical signal line 32 via the selection transistor 25. Further, the amplification transistor 24 and a current source I connected to one end of the vertical signal line 32 are included in a source follower that converts a voltage of the floating diffusion FD into a potential of the vertical signal line 32.

For example, the selection transistor 25 has a drain electrode connected to a source electrode of the amplification transistor 24 and a source electrode connected to the vertical signal line 32. A selection signal SEL that activates a high level is supplied from the row selection unit 12 to a gate electrode of the selection transistor 25. The selection transistor 25 becomes conductive in response to the selection signal SEL, so that the unit pixel 2 is in a selected state and a signal output from the amplification transistor 24 is transmitted to the vertical signal line 32.

Note that the selection transistor 25 may adopt a circuit configuration connected between the node of the high-potential-side power source $V_{DD}$ and a drain electrode of the amplification transistor 24. In addition, in this example, a 4 Tr configuration including the transfer transistor 22, the reset transistor 23, the amplification transistor 24, and the selection transistor 25, that is, including four transistors (Tr) is given as an example of the pixel circuit of the unit pixel 2. However, the invention is not limited thereto. For example, it is possible to adopt a 3 Tr configuration in which the selection transistor 25 is omitted and the amplification transistor 24 has a function of the selection transistor 25, or it is possible to adopt a configuration of 5 Tr or more in which the number of transistors is increased as necessary.

[Stacked Structure]

Figure 3:
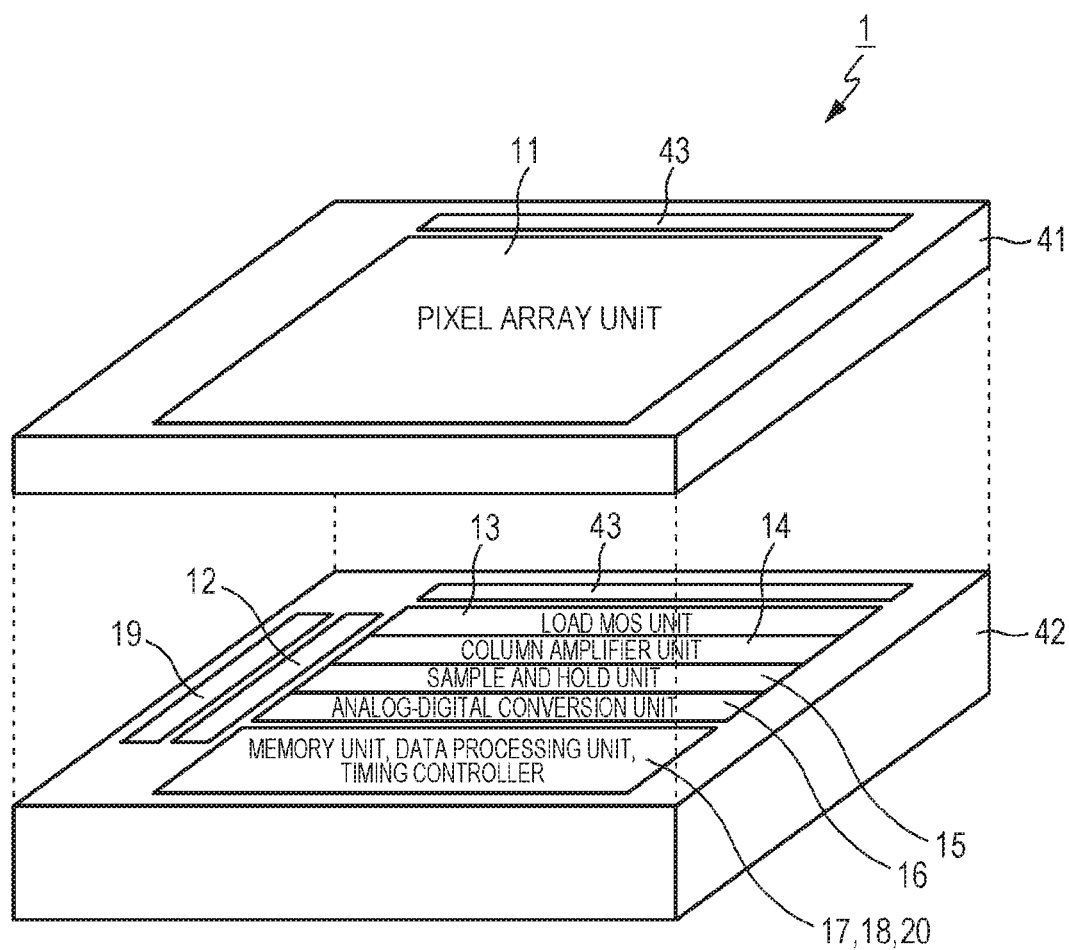
FIG. 3 is an exploded perspective view illustrating an outline of a stacked structure of the CMOS image sensor according to the present embodiment.

As illustrated in FIG. 3, the CMOS image sensor 1 according to the present embodiment having the above-described configuration may be set to an image sensor having a so-called stacked structure in which at least two semiconductor substrates (chips) corresponding to a first semiconductor substrate 41 and a second semiconductor substrate 42 are stacked. In addition, the CMOS image sensor 1 according to the present embodiment may have a back surface-illuminated pixel structure in which when a substrate surface on which a wiring layer is placed is set to a front surface (front), light irradiated from a back surface side on the opposite side is captured.

In the CMOS image sensor 1 having the stacked structure, the pixel array unit 11 obtained by disposing the unit pixels 2 having the back surface-illuminated pixel structure in the matrix form is formed on the first semiconductor substrate 41 in a first layer. In addition, circuit parts such as the row selection unit 12, the load MOS unit 13, the column amplifier unit 14, the sample and hold unit 15, the analog-digital conversion unit 16, the memory unit 17, the data processing unit 18, the output unit 19, and the timing controller 20 are formed on the second semiconductor substrate 42 in a second layer. Further, the first semiconductor substrate 41 in the first layer and the second semiconductor substrate 42 in the second layer are electrically connected through a via hole (VIA) 43.

According to the CMOS image sensor 1 having this stacked structure, the first semiconductor substrate 41 needs only to have a size (area) that allows the pixel array unit 11 to be formed, and thus it is possible to reduce not only the size (area) of the first semiconductor substrate 41 in the first layer but also a size of the entire chip. Moreover, a process suitable for manufacturing the unit pixel 2 can be applied to the first semiconductor substrate 41 in the first layer, and a process suitable for manufacturing the circuit parts can be applied to the second semiconductor substrate 42 in the second layer. Therefore, in manufacturing the CMOS image sensor 1, there is an advantage that the processes can be optimized.

Note that, here, a stacked structure of a two-layer structure in which the first semiconductor substrate 41 and the second semiconductor substrate 42 are stacked is illustrated. However, the stacked structure is not limited to the two-layer structure, and it is possible to adopt a structure of three or more layers. Further, in the case of the stacked structure of three or more layers, the circuit parts such as the row selection unit 12, the load MOS unit 13, the column amplifier unit 14, the sample and hold unit 15, the analog-digital conversion unit 16, the memory unit 17, the data processing unit 18, the output unit 19, and the timing controller 20 may be formed in a distributed manner on the second and subsequent semiconductor substrates.

In addition, in the above example, the case where the invention is applied to the CMOS image sensor 1 having the stacked structure is described as an example. However, the technology of the present disclosure is not limited to the application to the CMOS image sensor 1 having the stacked structure. That is, the technology of the present disclosure can be also applied to a so-called flat structure CMOS image sensor in which the circuit parts such as the row selection unit 12, the load MOS unit 13, the column amplifier unit 14, the sample and hold unit 15, the analog-digital conversion unit 16, the memory unit 17, the data processing unit 18, the output unit 19, and the timing controller 20 are formed on the same semiconductor substrate as that of the pixel array unit 11.

[With Regard to One AD Time]

Here, a description will be given of one AD time in a case where, for example, the single slope type analog-digital converter is used as the analog-digital converter of the analog-digital conversion unit 16. One AD time is a pixel signal reading and analog-digital conversion time for one time.

Here, one AD time will be described by comparing a case of the circuit configuration not having the column amplifier unit 14 with a case of the circuit configuration having the column amplifier unit 14. Further, in either circuit configuration, a description will be given of the case where the sample and hold unit 15 to which the technology of the present disclosure is applied is not provided.

(Circuit Configuration not Having Column Amplifier Unit)

Figure 4:
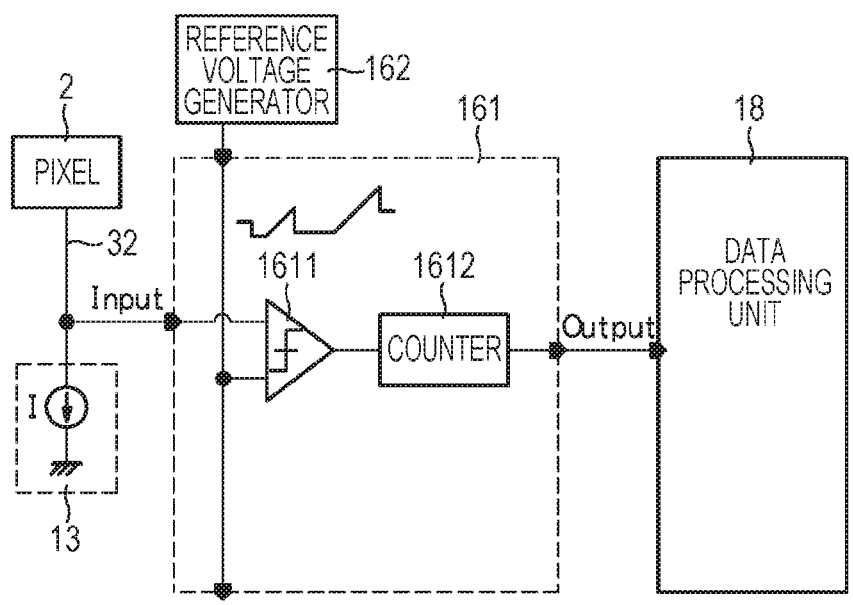
FIG. 4 is a circuit diagram illustrating a configuration for one pixel column of a CMOS image sensor having a circuit configuration which does not include a column amplifier unit.

First, a description will be given of one AD time of the CMOS image sensor having the circuit configuration which does not include the column amplifier unit 14. FIG. 4 illustrates a configuration for one pixel column of the CMOS image sensor having the circuit configuration which does not include the column amplifier unit.

A single slope type analog-digital converter 161 has a circuit configuration including a comparator 1611 and a counter 1612. In the single slope type analog-digital converter 161, a so-called ramp (RAMP) waveform (slope waveform) reference voltage whose voltage value gradually changes over time is used. The reference voltage of the ramp waveform is generated by a reference voltage generator 162. The reference voltage generator 162 can be configured using, for example, a DAC (digital-analog conversion) circuit.

The comparator 1611 uses the pixel signal read from the unit pixel 2 as a comparison input, uses the reference voltage generated by the reference voltage generator 162 as a reference input, and compares the two inputs. Then, in the comparator 1611, for example, an output is in a first state (for example, high level) when the reference voltage is larger than the pixel signal, and an output is in a second state (for example, low level) when the reference voltage is less than or equal to the pixel signal. In this way, the output signal of the comparator 1611 becomes a pulse signal having a pulse width corresponding to the level of the pixel signal.

A clock signal is given to the counter 1612 at the same timing as a timing at which the reference voltage starts to be supplied to the comparator 1611. Then, the counter 1612 measures a period of a pulse width of an output pulse of the comparator 1611, that is, a period from a start of a comparison operation to an end of the comparison operation, by performing a count operation in synchronization with the clock signal. A count result (count value) of the counter 1612 becomes a digital value obtained by digitizing an analog pixel signal.

As described above, in the analog-digital conversion unit 16 using the single slope type analog-digital converter 161 as the analog-digital converter, a reference voltage having a gradually changing analog value is generated, and a digital signal value is obtained from time information until a magnitude relationship between the reference voltage and the signal voltage changes.

The pixel signal includes a P-phase signal (reset signal) corresponding to a black level (reset level) output from the unit pixel 2 during reset, and a D-phase signal (data signal) corresponding to a signal level output from the unit pixel 2 during photoelectric conversion. Then, in the CMOS image sensor, for reading the pixel signal once, in a generally performed process, the P-phase signal is first converted from analog to digital, then the D-phase signal is converted from analog to digital, and thereafter a difference between the two signals is obtained. A process of taking the difference between the P-phase signal and the D-phase signal is a process for removing noise referred to as correlated double sampling (CDS).

Figure 5A:
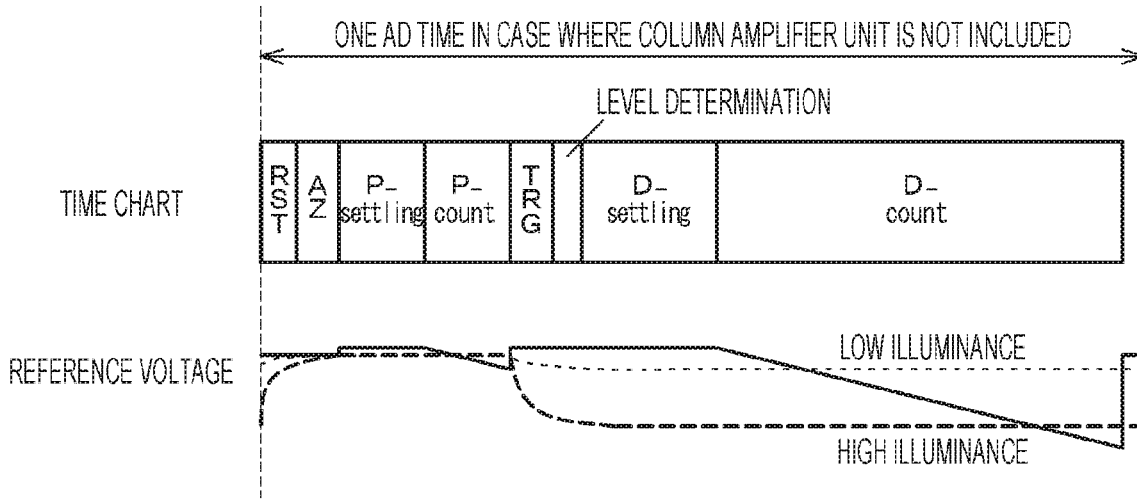
FIG. 5A is a waveform diagram for description of an operation of the circuit configuration which does not include the column amplifier unit.

FIG. 5A illustrates a time chart of analog-digital conversion and a slope waveform of a reference voltage in the CMOS image sensor not having the column amplifier unit.

In FIG. 5A, RST denotes a reset period of the unit pixel 2, $P_{\_settling}$ denotes a settling period of the P-phase signal, $P_{\_count}$ denotes an analog-digital conversion period of the P-phase signal, and TRG denotes a transfer period of the D-phase signal in the unit pixel 2 (that is, ON period of the transfer transistor 22). Further, level determination represents a level determination period of the pixel signal, $D_{\_settling}$ denotes a settling period of the D-phase signal, and $D_{\_count}$ denotes an analog-digital conversion period of the D-phase signal.

As is clear from FIG. 5A, in the single slope type analog-digital converter 161, most of one AD time is occupied by a settling period ($P_{\_settling}$, $D_{\_settling}$) of an input signal from the unit pixel 2 and a count period ($P_{\_count}$, $D_{\_count}$) of the counter 1612.

(Circuit Configuration Having Column Amplifier Unit)

Figure 6:
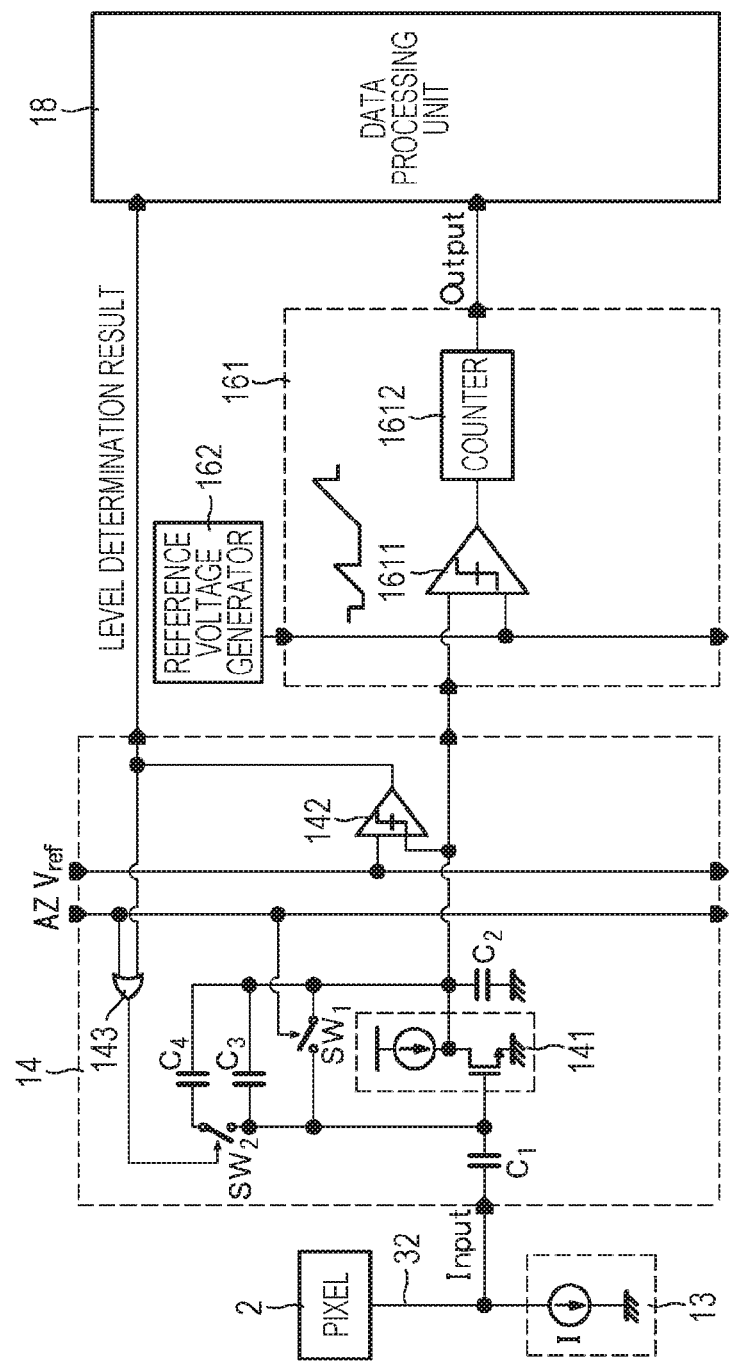
FIG. 6 is a circuit diagram illustrating a configuration for one pixel column of a CMOS image sensor having the circuit configuration which includes the column amplifier unit.

Next, a description will be given of one AD time of the CMOS image sensor having the circuit configuration which includes the column amplifier unit 14. FIG. 6 illustrates a configuration for one pixel column of the CMOS image sensor having the circuit configuration which includes the column amplifier unit.

The column amplifier unit 14 has a circuit configuration that includes an inverting amplifier 141, a level determination circuit 142, an OR circuit 143, an input capacitor $C_1$, an output capacitor $C_2$, at least two feedback capacitors $C_3$ and $C_4$, an auto zero switch $SW_1$, and a gain selector switch $SW_2$. The pixel signal output from the unit pixel 2 is input to the inverting amplifier 141 via the input capacitor $C_1$. The inverting amplifier 141 can take various forms. As a typical example, it is possible to use an N-type MOS input source grounded operational amplifier illustrated in FIG. 6.

The output capacitor $C_2$ is connected between an output terminal of the inverting amplifier 141 and a node of a reference potential (for example, ground). The auto zero switch $SW_1$ is connected between an input terminal and an output terminal of the inverting amplifier 141, and is turned ON (closed) in response to a control signal AZ given from the timing controller (see FIG. 1) to selectively short-circuit between the input terminal and the output terminal of the inverting amplifier 141. That is, the control signal AZ is an auto zero signal that initializes the column amplifier unit 14.

The feedback capacitor $C_3$ is connected between the input terminal and the output terminal of the inverting amplifier 141. The feedback capacitor $C_4$ is selectively connected in parallel to the feedback capacitor $C_3$ via the gain selector switch $SW_2$. The level determination circuit 142 compares an output voltage of the inverting amplifier 141 with a reference voltage $V_{ref}$ given from the outside, and uses a level determination result thereof as one input of the OR circuit 143. In addition, the level determination result of the level determination circuit 142 is also given to the data processing unit 18. The OR circuit 143 uses the control signal AZ as the other input, and performs ON/OFF control of the gain selector switch $SW_2$ in accordance with the output.

In the adaptive gain type column amplifier unit 14 configured as described above, when the control signal AZ is activated at the beginning of a series of operations, and the auto zero switch $SW_1$ is turned ON (closed), the input and output terminals of the inverting amplifier 141 are short-circuited, and the inverting amplifier 141 is initialized. Then, at the same time as an operating point of the inverting amplifier 141 is determined, a voltage difference between the potential of the vertical signal line 32 and the operating point of the inverting amplifier 141 during pixel resetting is held in the input capacitor $C_1$, and a DC offset is absorbed.

In this way, the column amplifier unit 14 operates with respect to the amount of change from an auto zero state (initialized state). In addition, at the same time, the feedback capacitor $C_3$ and the feedback capacitor $C_4$ are reset.

The gain of the column amplifier unit 14 is determined by a ratio of the input capacitor $C_1$ to the feedback capacitors $C_3$ and $C_4$. In a high gain mode, the gain selector switch $SW_2$ is in an OFF (open) state, and the gain is $C_1/C_3$. In a low gain mode, the gain selector switch $SW_2$ is in an ON (closed) state, and the gain is $C_1/(C_3+C_4)$.

After the gain selector switch $SW_2$ is turned ON during an auto zero (AZ) period, the gain selector switch $SW_2$ is turned OFF during settling of the P-phase signal. During an ON period (TRG period) of the transfer transistor 22 that transfers the D-phase signal within the unit pixel 2, when the D-phase signal is settled to some extent, the level determination circuit 142 compares the output voltage of the column amplifier unit 14 with the reference voltage $V_{ref}$, thereby distinguishing between light and darkness of the D-phase signal. When it is determined that the D-phase signal is bright (high illuminance), the output of the level determination circuit 142 corresponds to a high level. As a result, the gain selector switch $SW_2$ is turned ON.

A response speed of the column amplifier unit 14 is limited to some extent by the output capacitor $C_2$ provided for noise reduction. Thus, during the settling period of the P-phase signal and the settling period of the D-phase signal, not only settling of the potential of the vertical signal line 32 but also settling of the column amplifier unit 14 is performed.

Figure 7A:
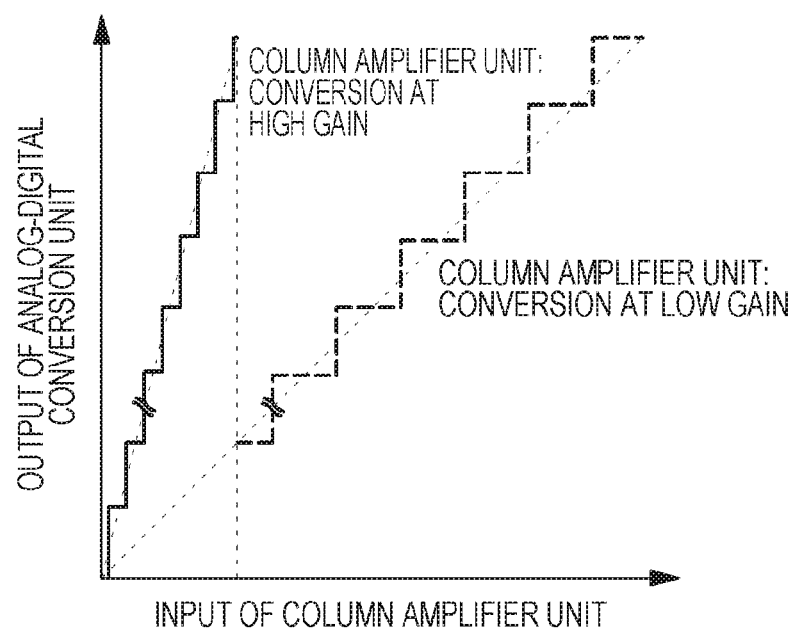
FIG. 7A is a diagram illustrating a relationship between an input of the column amplifier unit and an output of the analog-digital conversion unit.

In the column amplifier unit 14, during CDS, the amplifier gain is increased for the P-phase signal or dark (low illuminance) D-phase signal, and the amplifier gain is automatically decreased by the AGC function for the bright (high illuminance) D-phase signal, thereby adjusting a level of the pixel signal output from the unit pixel 2. That is, the column amplifier unit 14 can switch between at least two types of gains. FIG. 7A illustrates a relationship between the input of the column amplifier unit 14 and the output of the analog-digital conversion unit 16.

Figure 7B:
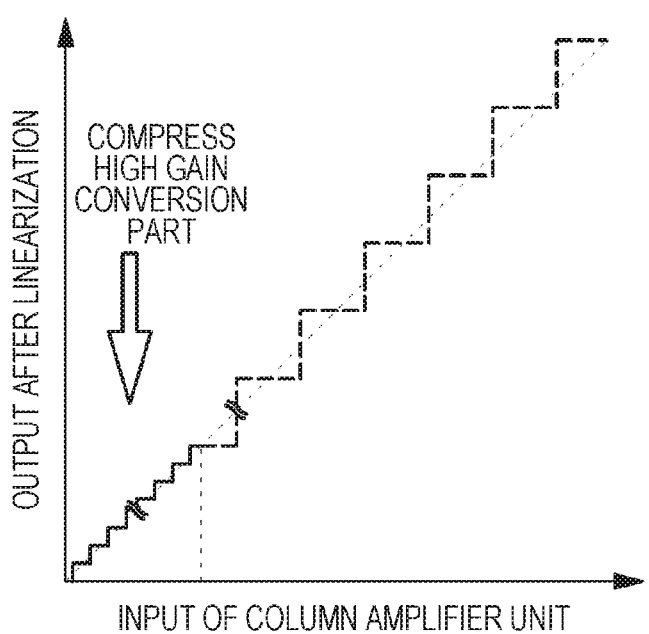
FIG. 7B is a diagram illustrating a relationship between an input of the column amplifier unit and an output after linearization.

Here, since the bright D-phase signal contains large light shot noise and a quantization error is buried therein, the resolution of the analog-digital conversion can be lowered. In addition, in the P-phase signal or dark D-phase signal, the amplified amount of the signal in the column amplifier unit 14 is linearized by performing compression processing on the basis of the level determination result of the level determination circuit 142 in the data processing unit 18 after analog-digital conversion, and an image is created. Therefore, the final resolution can be maintained even when the resolution of the analog-digital conversion unit 16 is lowered. Therefore, the resolution of the analog-digital conversion unit 16 can be lowered by providing the column amplifier unit 14 having the AGC function. FIG. 7B illustrates a relationship between an input of the column amplifier unit 14 and an output after linearization.

Figure 5B:
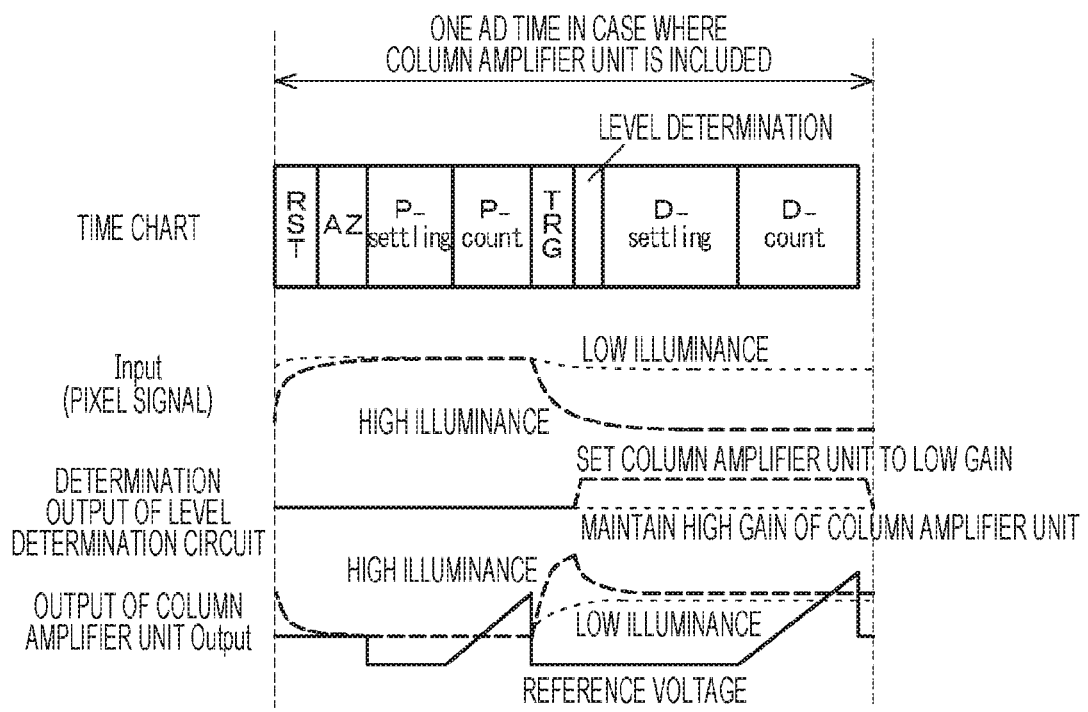
FIG. 5B is a waveform diagram for description of an operation of a circuit configuration which includes the column amplifier unit.

Further, in the analog-digital conversion unit 16 using the single slope type analog-digital converter 161, as illustrated in FIG. 5B, the analog-digital conversion time $D_{\_count}$ of the D-phase signal can be particularly shortened, and thus one AD time can be shortened. In addition, for a similar reason, since the amount of noise required for the analog-digital conversion unit 16 is reduced, a circuit scale affected by the magnitude of the noise can be reduced. Thus, it is possible to reduce the area or power of the analog-digital conversion unit 16, and to allocate the reduced amount to the column amplifier unit 14. In FIG. 5B, AZ denotes an auto-zero period in which the column amplifier unit 14 is initialized.

As described above, according to the CMOS image sensor having the column amplifier unit 14, when the gain is adaptively adjusted in the column amplifier unit 14, it is possible to shorten the analog-digital conversion time $D_{\_count}$ of the D-phase signal as is clear from FIG. 5B, and thus it is possible to shorten one AD time. However, even though the analog-digital conversion time $D_{\_count}$ of the D-phase signal can be shortened, the remaining count time of the counter 1612 and the settling time of the input signal remain. Thus, to shorten one AD time, there is a limit when the column amplifier unit 14 is merely provided.

[With Regard to Sample and Hold Unit]

Therefore, the CMOS image sensor 1 according to the present embodiment employs a configuration in which the sample and hold unit 15 to which the technology of the present disclosure is applied is provided between the column amplifier unit 14 and the analog-digital conversion unit 16. The sample and hold unit 15 has at least three capacitors for holding pixel signals and performs fetching of a pixel signal to one capacitor and outputting of an image signal fetched to another capacity to the analog-digital conversion unit 16 in parallel.

The sample and hold unit 15 can temporarily hold a pixel signal passing through the column amplifier unit 14. In this way, after settling is completed, the output voltage of the column amplifier unit 14 is held in the capacity of the sample and hold unit 15, while the column amplifier unit 14 can immediately shift to subsequent input signal fetching and settling. Then, while the column amplifier unit 14 fetches the subsequent input signal, the analog-digital conversion unit 16 performs analog-digital conversion on the voltage signal held in the sample and hold unit 15.

In this way, effective one AD time can be shortened by performing settling and analog-digital conversion in parallel, and thus it is possible to shorten a substantial pixel signal reading time including analog-digital conversion. Therefore, it is possible to improve a frame rate. Further, in a case where the frame rate is the same (in a case where the frame rate is not improved), a blank period during which reading and analog-digital conversion are not performed can be increased, and thus the average power consumption can be reduced.

In addition, the number of analog-digital conversion units 16 that operate in parallel may be increased to increase the frame rate. However, when the reading and analog-digital conversion time is shortened by the technology of the present disclosure, it is possible to reduce the number of analog-digital conversion units 16 that operate in parallel. As a result, the area of the CMOS image sensor 1 can be reduced and the cost can be reduced.

A specific example of the sample and hold unit 15 to which the technology of the present disclosure is applied will be described below. Note that in the following, of the two pixel signals output from the unit pixel 2 one after another in time series, when a pixel signal output first is set to an odd-numbered (odd row) pixel signal, and a pixel signal output later is set to an even-numbered (even row) pixel signal, a P-phase and D-phase of the respective pixel signals are referred to as an odd-numbered P-phase signal and D-phase signal, and an even-numbered P-phase signal and D-phase signal.

Example 1

Figure 8:
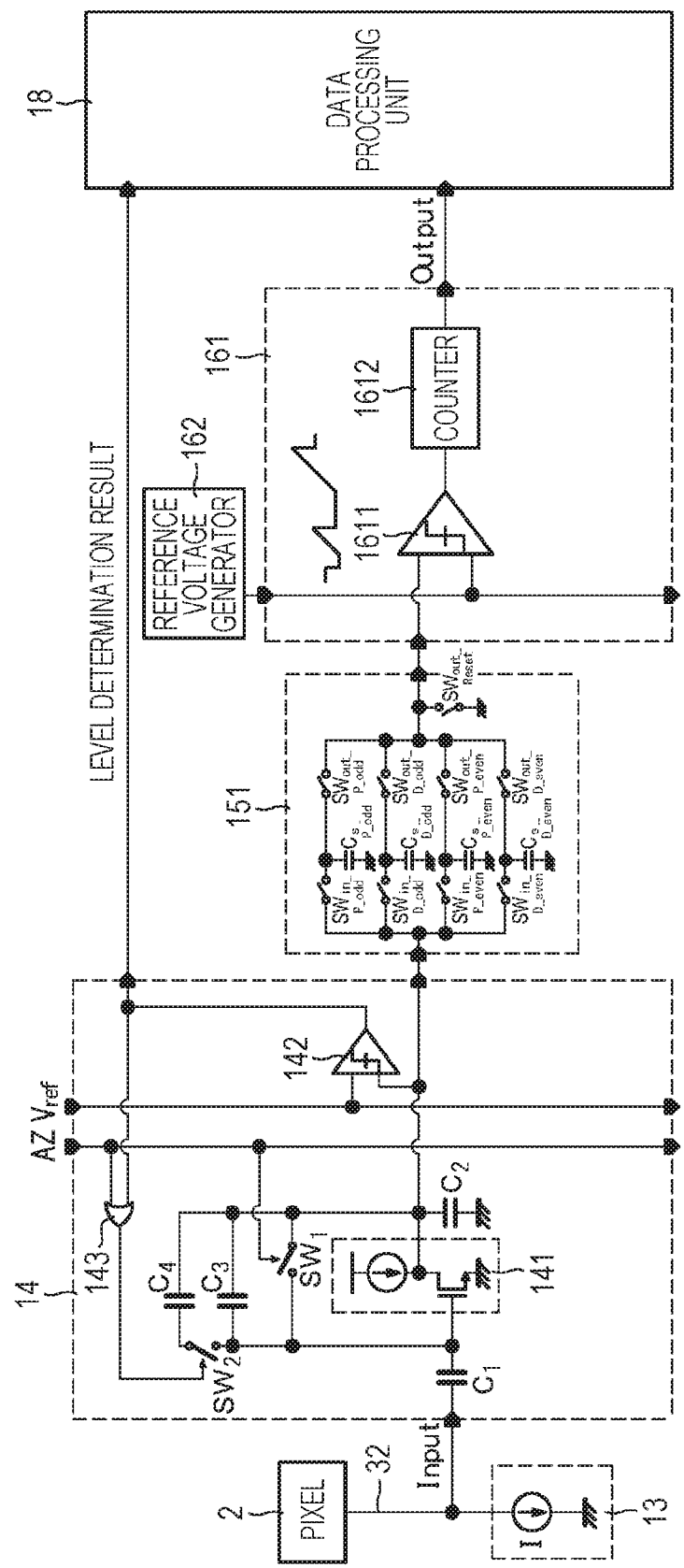
FIG. 8 is a circuit diagram illustrating a configuration for one pixel column of a CMOS image sensor according to Example 1.

Example 1 is an example in which the sample and hold unit 15 includes four capacitors for holding pixel signals. In Example 1, similarly to the case of the circuit configuration illustrated in FIG. 6, an N-type MOS input source grounded operational amplifier is used as the inverting amplifier 141 of the column amplifier unit 14, and a single slope type analog-digital converter is used as the analog-digital converter 161 of the analog-digital conversion unit 16. For example, the sample and hold unit 15 includes a set of a plurality of sample and hold circuits 151 provided for each pixel column. Further, each of the sample and hold circuits 151 provided for each pixel column has four capacitors for holding pixel signals. FIG. 8 illustrates a configuration for one pixel column of the CMOS image sensor according to Example 1.

As illustrated in FIG. 8, the sample and hold circuit 151 provided for each pixel column includes a total of four capacitors $C_{s\_P\_odd}$, $C_{s\_D\_odd}$, $C_{s\_P\_even}$, and $C_{s\_D\_even}$ corresponding to two capacitors $C_{s\_P\_odd}$ and $C_{s\_D\_odd}$ for holding the odd-numbered P-phase signal and D-phase signal and two capacitors $C_{s\_P\_even}$ and $C_{s\_D\_even}$ for holding the even-numbered P-phase signal and D-phase signal. Each end of the four capacitors $C_{s\_P\_odd}$, $C_{s\_D\_odd}$, $C_{s\_P\_even}$, and $C_{s\_D\_even}$ is connected to a node of a reference potential (for example, ground).

A switch $SW_{in\_P\_odd}$ and a switch $SW_{in\_D\_odd}$ are connected between a circuit input terminal of the sample and hold circuit 151 and each of the other ends of the two capacitors $C_{s\_P\_odd}$ and $C_{s\_D\_odd}$. In addition, a switch $SW_{in\_P\_even}$ and a switch $SW_{in\_D\_even}$ are connected between a circuit input terminal of the sample and hold circuit 151 and each of the other ends of the two capacitors $C_{s\_P\_even}$ and $C_{s\_D\_even}$.

A switch $SW_{out\_P\_odd}$ and a switch $SW_{out\_D\_odd}$ are connected between each of the other ends of the two capacitors $C_{s\_P\_odd}$ and $C_{s\_D\_odd}$ and a circuit output terminal of the sample and hold circuit 151. In addition, a switch $SW_{out\_P\_even}$ and a switch $SW_{out\_D\_even}$ are connected between each of the other ends of the two capacitors $C_{s\_P\_even}$ and $C_{s\_D\_even}$ and the circuit output terminal of the sample and hold circuit 151.

The sample and hold circuit 151 includes a reset switch $SW_{out\_Reset}$ connected between a circuit output terminal and a node of a reference potential (for example, ground). The reset switch $SW_{out\_Reset}$ resets a potential of the circuit output terminal of the sample and hold circuit 151, that is, the circuit output terminal that outputs a pixel signal to the analog-digital conversion unit 16 (analog-digital converter 161).

In the sample and hold circuit 151 having the above circuit configuration, ON/OFF of switches $SW_{in\_P\_odd}$, $SW_{in\_D\_odd}$, $SW_{in\_P\_even}$, and $SW_{in\_D\_even}$ on the input side, switches $SW_{out\_P\_odd}$, $SW_{out\_D\_odd}$, $SW_{out\_P\_even}$, and $SW_{out\_D\_even}$ on the output side, and the reset switch $SW_{out\_Reset}$ is controlled by the timing controller 20 of FIG. 1.

Further, the odd-numbered P-phase signal output from the column amplifier unit 14 is held in the capacitor $C_{s\_P\_odd}$ via the switch $SW_{in\_P\_odd}$, and the odd-numbered D-phase signal is held in the capacitor $C_{s\_D\_odd}$ via the switch $SW_{in\_D\_odd}$. The even-numbered P-phase signal output from the column amplifier unit 14 is held in the capacitor $C_{s\_P\_even}$ via the switch $SW_{in\_P\_even}$, and the even-numbered D-phase signal is held in the capacitor $C_{s\_D\_even}$ via the switch $SW_{in\_D\_even}$.

Next, a description will be given of a circuit operation of the CMOS image sensor 1 according to the present embodiment including the sample and hold circuit 151 having the above circuit configuration, mainly a circuit operation of the sample and hold circuit 151, with reference to a timing waveform diagram of FIG. 9. The circuit operation is executed under the control of the timing controller 20.

Figure 9:
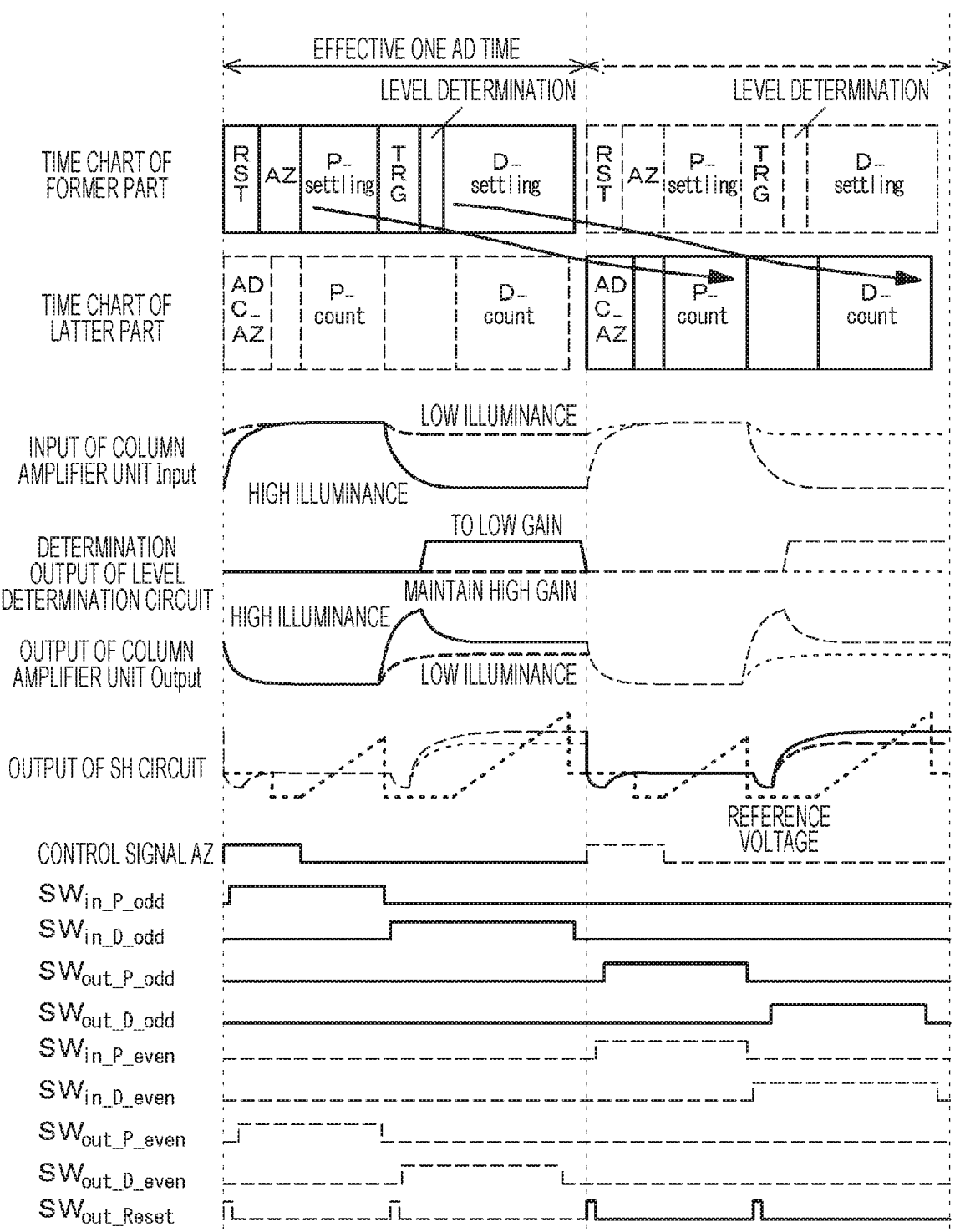
FIG. 9 is a timing waveform diagram for description of a circuit operation of the CMOS image sensor according to the present embodiment.

The timing waveform diagram of FIG. 9 illustrates a time chart of a former part of a signal processing system, that is, the column amplifier unit 14+the sample and hold circuit 151, and a time chart of a latter part of the signal processing system, that is, the sample and hold circuit 151+the analog-digital converter 161. Further, the diagram illustrates respective waveforms of the input of the column amplifier unit 14, the output of the level determination circuit 142, the output Output of the column amplifier unit 14, the output of the sample and hold circuit 151, the reference voltage, and the control signal AZ. Further, the diagram illustrates ON/OFF states of the odd-numbered $SW_{in\_P\_odd}$, $SW_{in\_D\_odd}$, $SW_{out\_P\_odd}$, and $SW_{out\_D\_odd}$, the even-numbered $SW_{in\_P\_even}$, $SW_{in\_D\_even}$, $SW_{out\_P\_even}$, and $SW_{out\_D\_even}$, and the reset switch $SW_{out\_Reset}$.

In the sample and hold circuit 151, first, the switch $SW_{in\_P\_odd}$ and the switch $SW_{in\_D\_odd}$ on the input side are successively turned ON, and the odd-numbered P-phase signal and D-phase signal are fetched and held in the odd-numbered capacitors $C_{s\_P\_odd}$ and $C_{s\_D\_odd}$. Then, while the odd-numbered P-phase signal and D-phase signal are fetched, the switch $SW_{out\_P\_even}$ and the switch $SW_{out\_D\_even}$ on the output side are successively turned ON, and the even-numbered P-phase signal and D-phase signal held in the even-numbered capacitors $C_{s\_P\_even}$ and $C_{s\_D\_even}$ in a previous operation cycle are successively output to the analog-digital converter 161.

Similarly, first, the switch $SW_{in\_P\_even}$ and the switch $SW_{in\_D\_even}$ on the input side are successively turned ON, and the even-numbered P-phase signal and D-phase signal are fetched and held in the even-numbered capacitors $C_{s\_P\_even}$ and $C_{s\_D\_even}$. Then, while the even-numbered P-phase signal and D-phase signal are fetched, the switch $SW_{out\_P\_odd}$ and the switch $SW_{out\_D\_odd}$ on the output side are successively turned ON, and the odd-numbered P-phase signal and D-phase signal held in the odd-numbered capacitors $C_{s\_P\_odd}$ and $C_{s\_P\_odd}$ in a previous operation cycle are successively output to the analog-digital converter 161.

In this basic operation, the switches $SW_{out\_P\_odd}$, $SW_{out\_D\_odd}$, $SW_{out\_P\_even}$, and $SW_{out\_D\_even}$ on the output side are turned ON one by one in order. However, from when each switch is turned OFF and until a subsequent switch is turned ON, the reset switch $SW_{out\_Reset}$ is turned ON for a short period. By this action of the reset switch $SW_{out\_Reset}$, charges accumulated in a parasitic capacitor of an output wiring of the sample and hold circuit 151 or an input parasitic capacitor of the analog-digital converter 161 are reset once, so that it is possible to prevent a history of each signal transferred to the analog-digital converter 161 from being mixed with a subsequently transferred signal.

As described above, in the CMOS image sensor 1 having the sample and hold unit 15 between the column amplifier unit 14 and the analog-digital conversion unit 16, the output voltage of the column amplifier unit 14 can be temporarily held by the sample and hold unit 15. In this way, after settling is completed, the output voltage of the column amplifier unit 14 is held in the capacity of the sample and hold unit 15, while the column amplifier unit 14 can immediately shift to subsequent input signal fetching and settling. Then, while the column amplifier unit 14 fetches the subsequent input signal, the analog-digital conversion unit 16 performs analog-digital conversion on the voltage signal held in the sample and hold unit 15.

In this way, effective one AD time can be shortened by performing settling and analog-digital conversion in parallel. In a case where the settling time and analog-digital conversion time are the same, the effect of shortening one AD time is the highest, and one AD time can be reduced to almost half when compared to the case where settling and analog-digital conversion are not performed in parallel.

When a signal is sampled and held, kT/C noise is generated. However, in the CMOS image sensor 1 according to the present embodiment, an influence thereof can be suppressed by using an AGC operation of the column amplifier unit 14. For the P-phase signal and the dark D-phase signal, the column amplifier unit 14 is in a high gain mode, and thus the kT/C noise of the sample and hold unit 15 can be suppressed in terms of input. A reason therefor may be as follows. When the amplified amount of the signal in the column amplifier unit 14 is linearized by performing compression processing using the data processing unit 18 after analog-digital conversion, the kT/C noise is also compressed and reduced. On the other hand, for the bright D-phase signal, the column amplifier unit 14 is in a low gain mode, and thus the above effect may not be obtained for the kT/C noise of the sample and hold unit 15. However, since the bright D-phase signal contains large light shot noise, the kT/C noise is buried therein and is not a problem.

Based on the same principle, the resolution of the analog-digital conversion can be lowered using the AGC operation of the column amplifier unit 14. Further, since the amount of noise required for the analog-digital conversion unit 16 is reduced, the power consumption and area of the analog-digital conversion unit 16 can be reduced and used for other blocks.

Example 2

Figure 10:
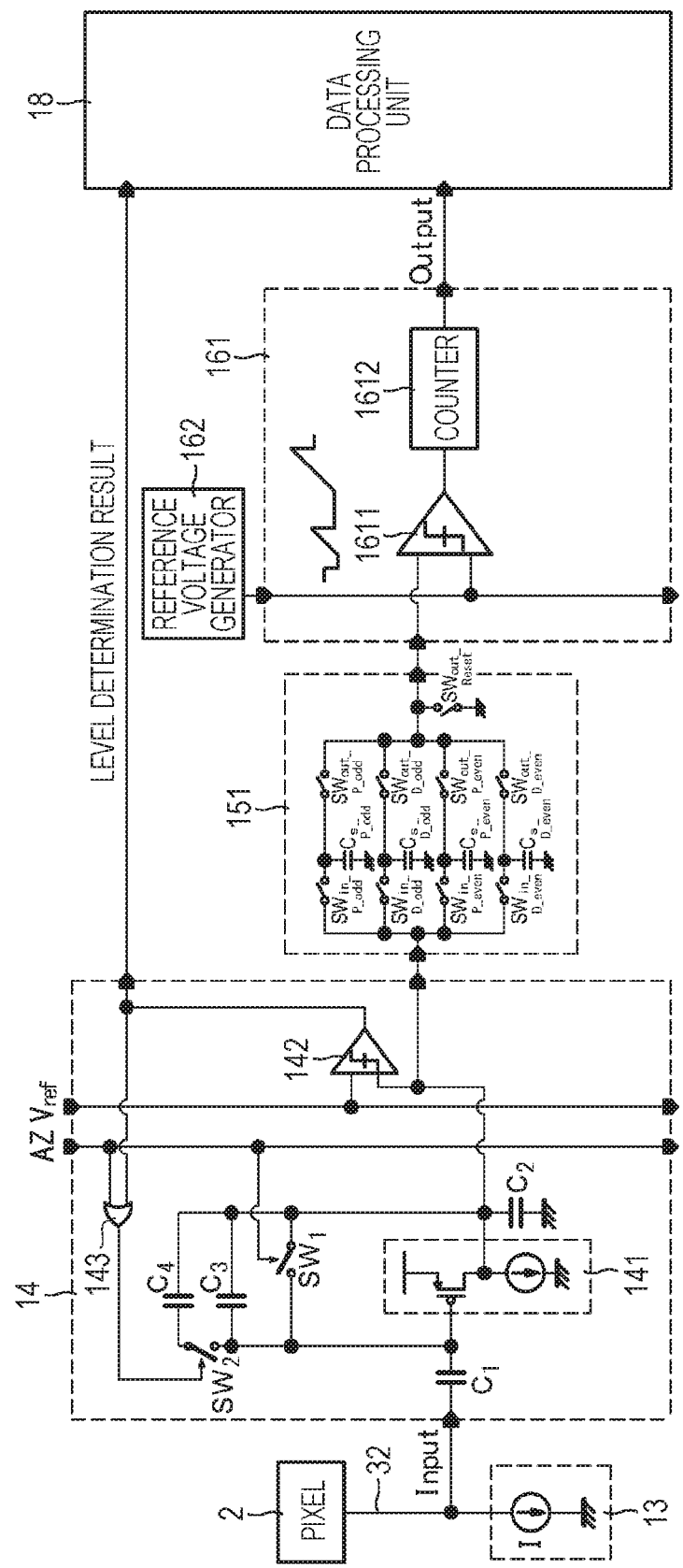
FIG. 10 is a circuit diagram illustrating a configuration for one pixel column of a CMOS image sensor according to Example 2.

Example 2 is a modification of Example 1 and is an example in which the inverting amplifier 141 includes a P-type MOS input source grounded operational amplifier. FIG. 10 illustrates a configuration for one pixel column of a CMOS image sensor according to Example 2.

The inverting amplifier 141 of the column amplifier unit 14 can take various forms. In Example 1, the N-type MOS input source grounded operational amplifier is used as the inverting amplifier 141. On the other hand, in Example 2, the P-type MOS input source grounded operational amplifier is used as the inverting amplifier 141. In this way, even in a case where the P-type MOS input source grounded operational amplifier is used as the inverting amplifier 141, it is possible to obtain a similar operation and effect to those of Example 1 using the N-type MOS input source grounded operational amplifier.

Example 3

Figure 11:
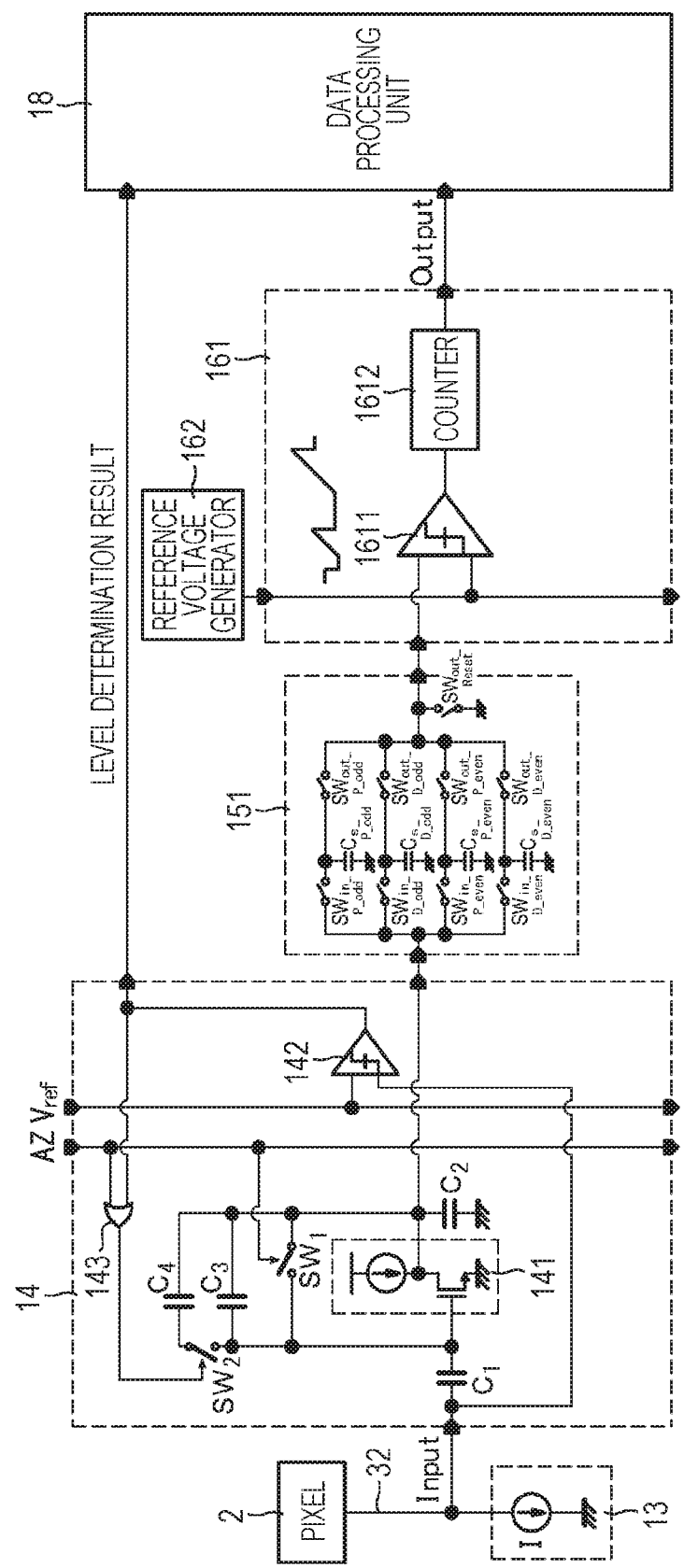
FIG. 11 is a circuit diagram illustrating a configuration for one pixel column of a CMOS image sensor according to Example 3.

Example 3 is a modification of Example 1 and is an example in which an input of the inverting amplifier 141 is used as an input of the level determination circuit 142. FIG. 11 illustrates a configuration for one pixel column of a CMOS image sensor according to Example 3.

In Example 1, an output of the inverting amplifier 141, that is, an output of the column amplifier unit 14 is used as an input of the level determination circuit 142. On the other hand, in Example 3, an input of the inverting amplifier 141, that is, an input of the column amplifier unit 14 is used as an input of the level determination circuit 142. In this way, even in a case where the input of the inverting amplifier 141 is used as the input of the level determination circuit 142, it is possible to obtain a similar operation and effect to those of Example 1. A technology of Example 3 can be also applied to Example 2.

Example 4

Figure 12:
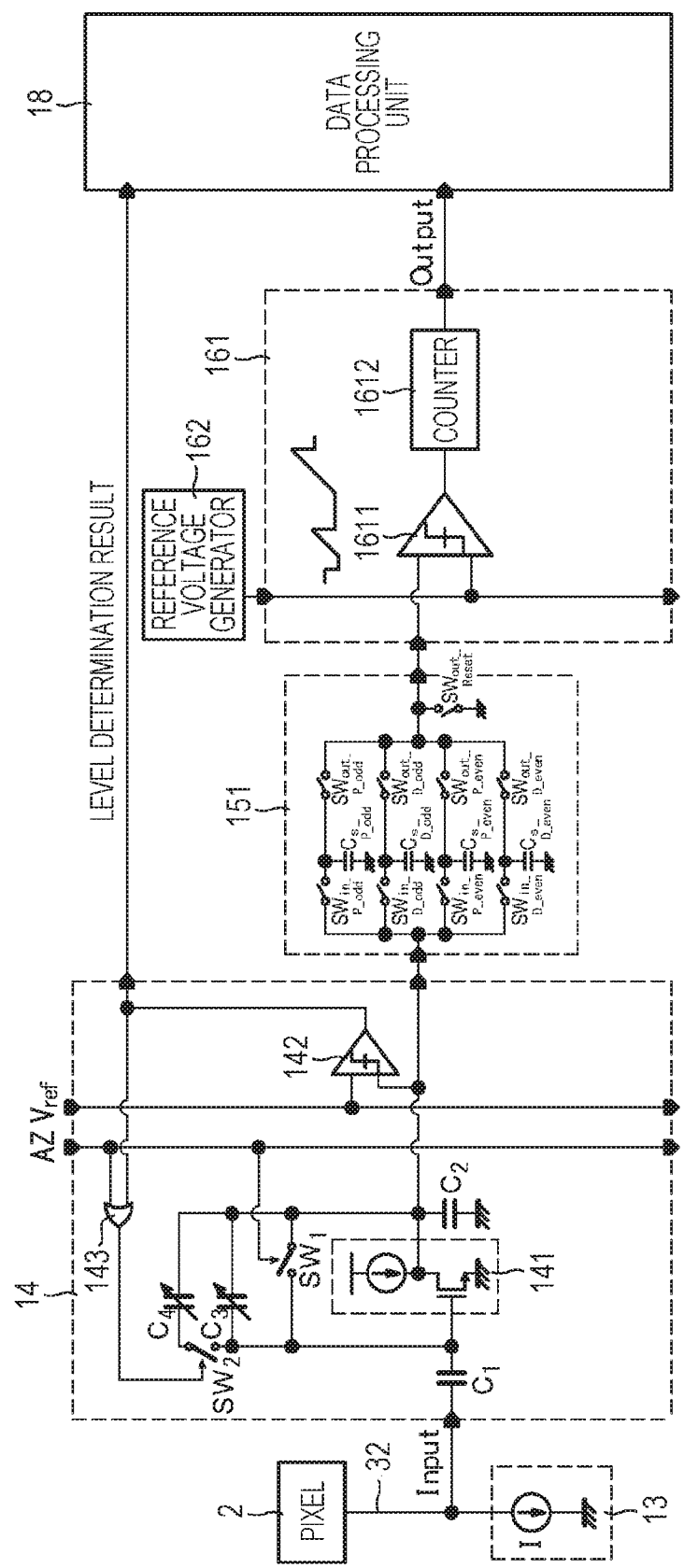
FIG. 12 is a circuit diagram illustrating a configuration for one pixel column of a CMOS image sensor according to Example 4.

Example 4 is a modification of Example 1 and is an example in which capacitance values of the feedback capacitors $C_3$ and $C_4$ of the column amplifier unit 14 are set to be variable. FIG. 12 illustrates a configuration for one pixel column of a CMOS image sensor according to Example 4.

In Example 1, the capacitance values of the feedback capacitors $C_3$ and $C_4$ of the column amplifier unit 14 are set to be fixed. On the other hand, in Example 4, variable capacitors are used as the feedback capacitors $C_3$ and $C_4$ of the column amplifier unit 14, and the capacitance values of the feedback capacitors $C_3$ and $C_4$ are set to be variable. In this way, by setting the capacitance values of the feedback capacitors $C_3$ and $C_4$ to be variable, it is possible to set finer gain in the column amplifier unit 14. A technology of Example 4 can be also applied to Example 2 and Example 3.

Example 5

Figure 13:
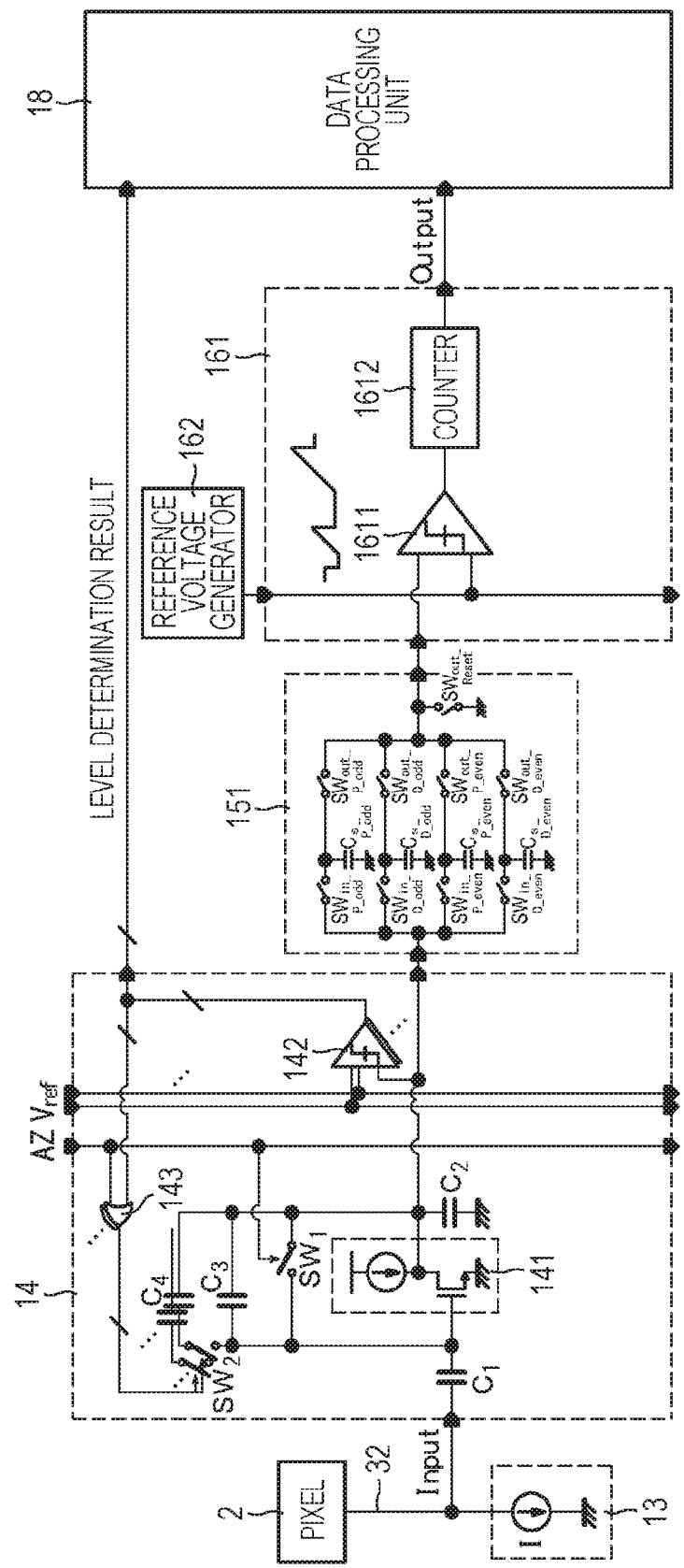
FIG. 13 is a circuit diagram illustrating a configuration for one pixel column of a CMOS image sensor according to Example 5.

Example 5 is a modification of Example 1 and is an example of having a plurality of level determination circuits 142. FIG. 13 illustrates a configuration for one pixel column of a CMOS image sensor according to Example 5.

In Example 1, one level determination circuit 142 is provided, and the determination output of the level determination circuit 142 is set to one bit. On the other hand, in Example 5, a plurality of level determination circuits 142 is provided. Accordingly, a plurality of reference voltages $V_{ref}$ having different voltage values is supplied to each of the plurality of level determination circuits 142, and level determination results of a plurality of bits are output from the plurality of level determination circuits 142. In addition, a plurality of OR circuits 143, feedback capacitors $C_4$, and gain selector switches $SW_2$ are provided to correspond to the plurality of level determination circuits 142.

As described above, when the column amplifier unit 14 includes the plurality of level determination circuits 142, and the level determination results are set to have a plurality of bits, it is possible to more finely control the adaptive gain. A technology of Example 5 can be also applied to Example 2, Example 3, and Example 4.

Example 6

Figure 14:
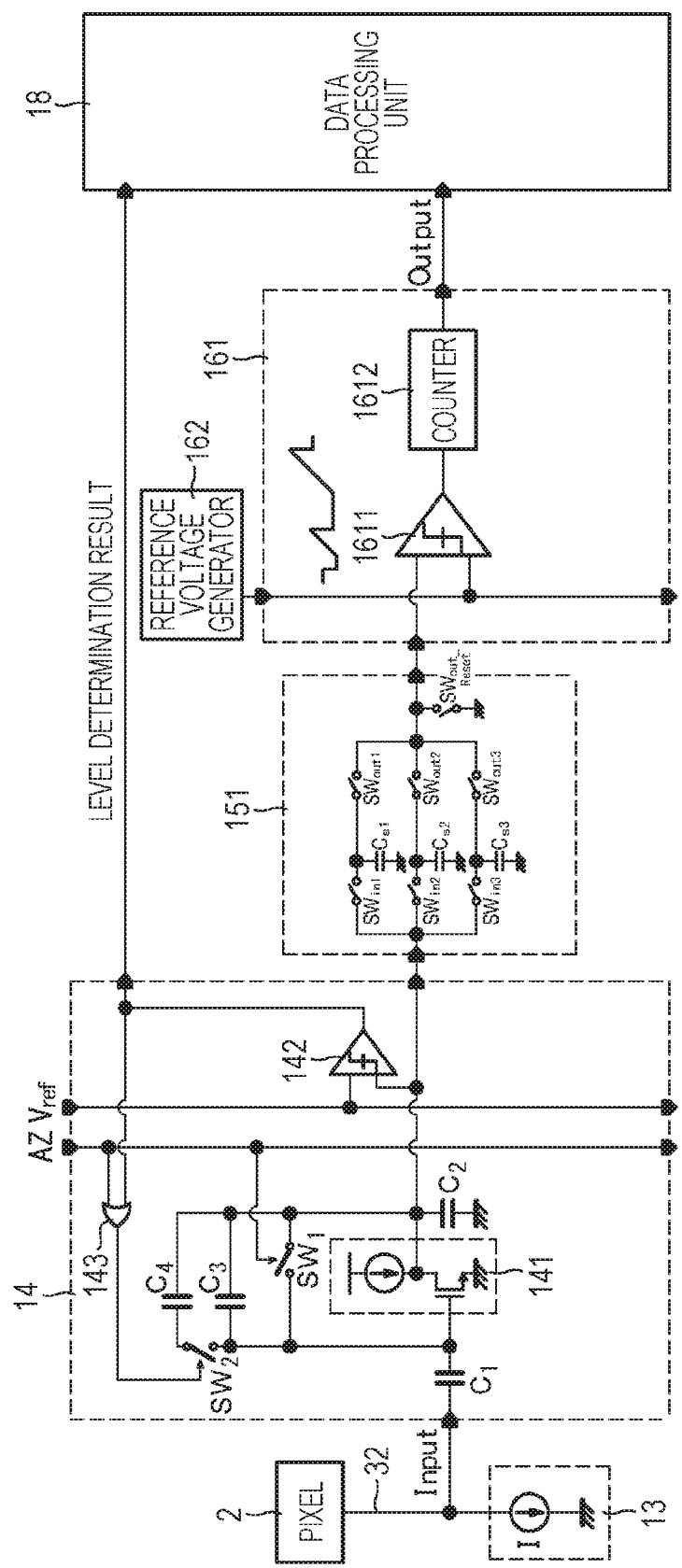
FIG. 14 is a circuit diagram illustrating a configuration for one pixel column of a CMOS image sensor according to Example 6.

Example 6 is an example in which the sample and hold unit 15 includes three capacitors for holding pixel signals. FIG. 14 illustrates a configuration for one pixel column of a CMOS image sensor according to Example 6.

As illustrated in FIG. 14, each of a plurality of sample and hold circuits 151 of the sample and hold unit 15 includes three capacitors $C_{s1}$, $C_{s2}$, and $C_{s3}$ as capacitors for holding pixel signals. Each end of each of the three capacitors $C_{s1}$, $C_{s2}$, and $C_{s3}$ is connected to the node of the reference potential (for example, ground).

Three switches $SW_{in1}$, $SW_{in2}$, and $SW_{in3}$ are connected between a circuit input terminal of the sample and hold circuit 151 and each of the other ends of the three capacitors $C_{s1}$, $C_{s2}$, and $C_{s3}$. In addition, three switches $SW_{out1}$, $SW_{out2}$, and $SW_{out3}$ are connected between each of the other ends of the three capacitors $C_{s1}$, $C_{s2}$, and $C_{s3}$ and a circuit output terminal of the sample and hold circuit 151.

Figure 15:
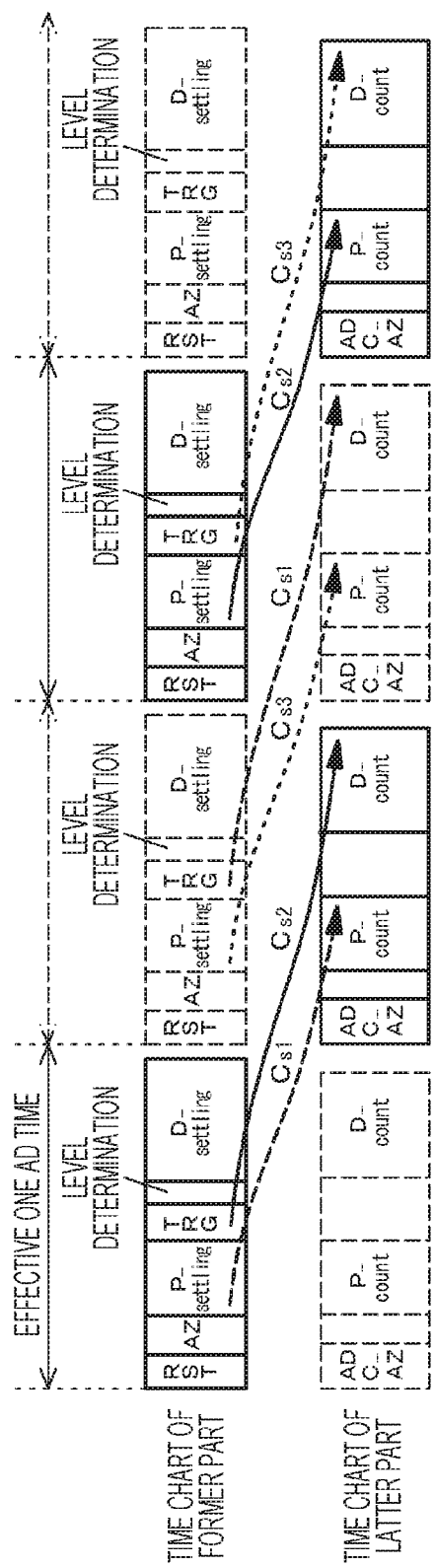
FIG. 15 is a timing chart for description of a circuit operation of the CMOS image sensor according to the Example 6.

FIG. 15 illustrates a timing chart for description of a circuit operation of the CMOS image sensor according to the Example 6. FIG. 15 illustrates each of a time chart of a former part of a signal processing system, that is, the column amplifier unit 14+the sample and hold circuit 151, and a time chart of a latter part of the signal processing system, that is, the sample and hold circuit 151+the analog-digital converter 161.

In the case of the time chart illustrated in FIG. 15, an analog-digital conversion period $P_{\_count}$ of the P-phase signal does not overlap a period from a transfer period TRG of the D-phase signal to a setting period $D_{\_settling}$ of the D-phase signal. In this way, in the case of a timing at which the period of $P_{\_count}$ does not overlap the period from TRG to $D_{\_settling}$, immediately after completing analog-digital conversion of the P-phase signal, the capacitor $C_{s1}$ can be used for settling of the immediately subsequent D-phase signal.

This description means that a similar analog-digital conversion operation to that of the case of the four capacitors $C_{s\_P\_odd}$, $C_{s\_D\_odd}$, $C_{s\_P\_even}$, and $C_{s\_D\_even}$ (that is, case of Example 1) can be realized by the three capacitors $C_{s1}$, $C_{s2}$, and $C_{s3}$. Further, in this case, a signal among the even-numbered/odd-numbered P-phase/D-phase signals for which each of the three capacitors $C_{s1}$, $C_{s2}$, and $C_{s3}$ is used changes every time.

Similarly to the case of Example 1, a modification such as Example 2, Example 3, Example 4, or Example 5 can be applied to Example 6.

Modification of Embodiment

In the above embodiment, the case of application to the CMOS image sensor formed by disposing the unit pixels 2 in the matrix form is described as an example. However, the technology of the present disclosure is not limited to application to the CMOS image sensor. That is, the technology of the present disclosure can be applied to all X-Y address type solid-state image pick-up devices formed by two-dimensionally disposing the unit pixels 2 in the matrix form.

In addition, the technology of the present disclosure is not limited to application to a solid-state image pick-up device that detects a distribution of an incident light amount of visible light and captures the distribution as an image, and is applicable to all solid-state image pick-up devices that capture a distribution of an incident amount of an infrared ray, an X-ray, particles, etc. as an image.

Application Example of Embodiment

Figure 16:
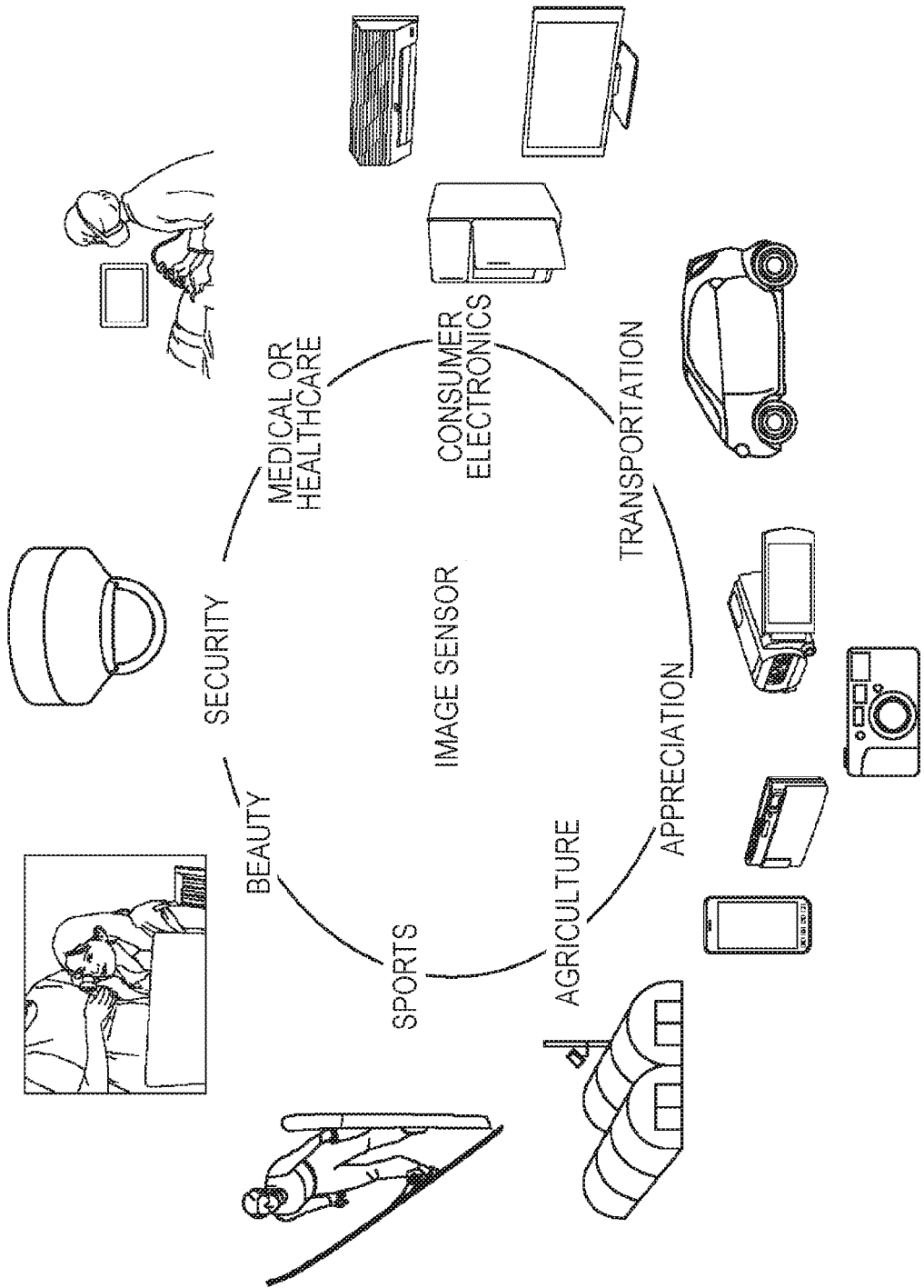
FIG. 16 is a diagram illustrating an application example of a technology of the present disclosure.

For example, the CMOS image sensor 1 according to the present embodiment described above can be used in various devices that sense light such as visible light, infrared light, ultraviolet light, X-ray, etc. as illustrated in FIG. 16. Specific examples of the various devices are listed below.

Device that captures an image used for appreciation such as a digital camera and a mobile device having a camera function Device used in a field of transportation such as an in-vehicle sensor that captures an image of a front, a rear, surroundings, interior, etc. of an automobile for safe driving such as automatic stop, or recognition of a condition of a driver, etc., a surveillance camera that monitors a traveling vehicle or a road, a distance measurement sensor that measures a distance between vehicles, etc.

Device used in a field of consumer electronics, such as a television receiver, a refrigerator, and an air conditioner for capturing an image of a gesture of a user and performing a device operation in accordance with the gesture.

Device used in a medical or healthcare field such as an endoscope and a device that performs angiography by receiving infrared light.

Device used in a security field, such as a surveillance camera for crime prevention and a camera for personal authentication.

Device used in a field of beauty, such as a skin measuring instrument that captures an image of skin and a microscope that captures an image of scalp.

Device used in a field of sports, such as an action camera or a wearable camera for sports applications, etc.

Device used in a field of agriculture, such as a camera for monitoring conditions of fields or crops.

<Application Example of Technology of Present Disclosure>

The technology of the present disclosure can be applied to various products. Hereinafter, more specific application examples will be described.

[Electronic Device of the Present Disclosure]

Here, a description will be given of a case where the invention is applied to an electronic device such as an image pick-up device such as a digital still camera and a video camera, a mobile terminal device having an image pick-up function such as a mobile phone, and a copier using a solid-state image pick-up device in an image reader.

Figure 17:
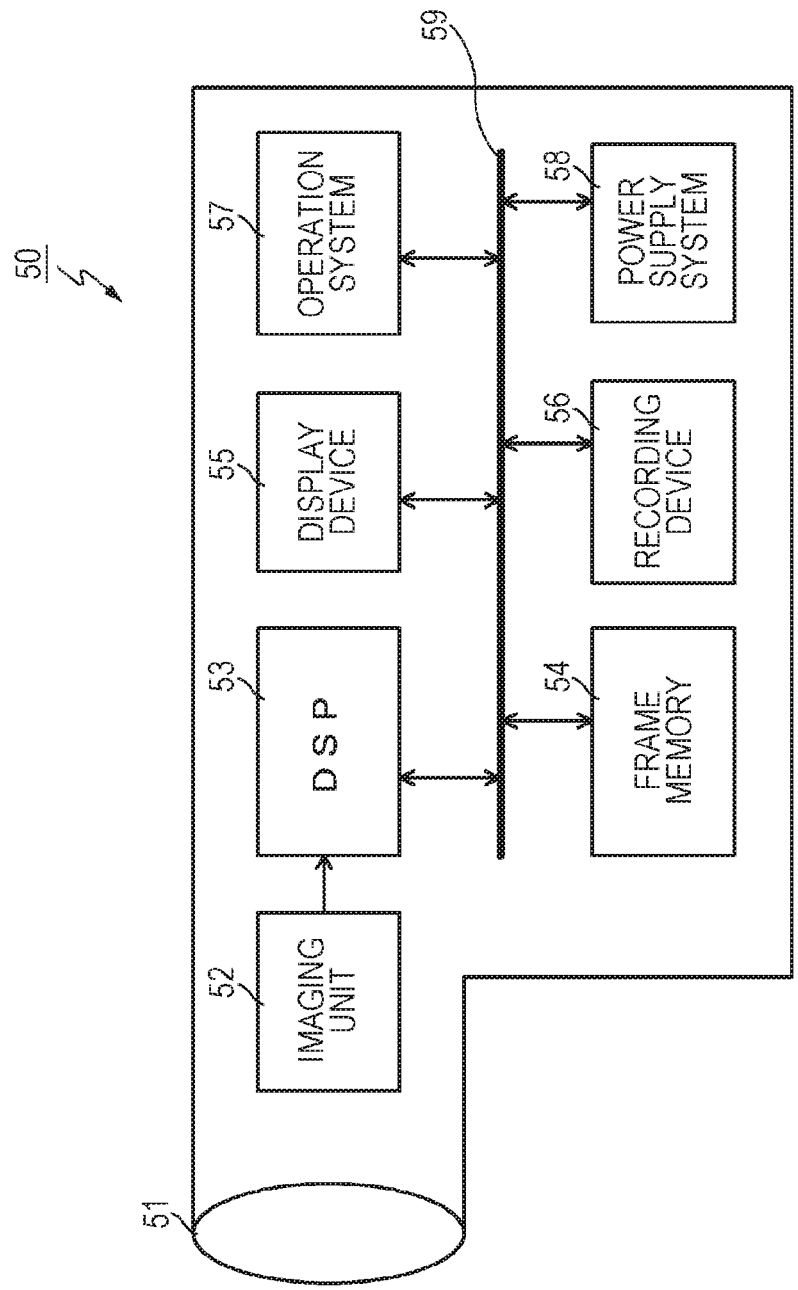
FIG. 17 is a block diagram illustrating a configuration of an image pick-up device that is an example of an electronic device of the present disclosure.

FIG. 17 is a block diagram illustrating a configuration of an image pick-up device that is an example of an electronic device of the present disclosure. As illustrated in FIG. 17, the image pick-up device 50 according to this example includes an imaging optical system 51 including a lens group, etc., an imaging unit 52, a DSP circuit 53, a frame memory 54, a display device 55, a recording device 56, an operation system 57, a power supply system 58, etc. Further, in an obtained configuration, the DSP circuit 53, the frame memory 54, the display device 55, the recording device 56, the operation system 57, and the power supply system 58 are connected to each other via a bus line 59.

The imaging optical system 51 takes in incident light (image light) from a subject and forms an image on an imaging surface of the imaging unit 52. The imaging unit 52 converts the amount of incident light formed as an image on the imaging surface by the imaging optical system 51 into an electrical signal for each pixel and outputs the electrical signal as a pixel signal. The DSP circuit 53 performs general camera signal processing such as white balance processing, demosaic processing, and gamma correction processing, for example.

The frame memory 54 is used for storing data as appropriate during the signal processing in the DSP circuit 53. The display device 55 includes a panel type display device such as a liquid crystal display device and an organic electroluminescence (EL) display device, and displays a moving image or a still image captured by the imaging unit 52. The recording device 56 records the moving image or still image captured by the imaging unit 52 on a recording medium such as a portable semiconductor memory, an optical disc, and a hard disk drive (HDD).

The operation system 57 issues operation commands for various functions of the image pick-up device 50 under the operation of the user. The power supply system 58 appropriately supplies various power supplies serving as operation power supplies for the DSP circuit 53, the frame memory 54, the display device 55, the recording device 56, and the operation system 57 to these supply targets.

Such an image pick-up device 50 is applied to a camera module for a video camera or a digital still camera, and further a mobile device such as a smartphone and a mobile phone. Further, in this image pick-up device 50, the CMOS image sensor according to the above-described embodiment can be used as the imaging unit 52. As a result, it is possible to shorten one AD time corresponding to a pixel signal reading and analog-digital conversion time for one time, and thus which can contribute to, for example, speeding up an imaging operation.

[Example of Application to Moving Body]

In addition, for example, the technology of the present disclosure may be realized as a device mounted on any type of moving body such as an automobile, an electric vehicle, a hybrid electric vehicle, a motorcycle, a bicycle, a personal mobility, an airplane, a drone, a ship, and a robot.

Figure 18:
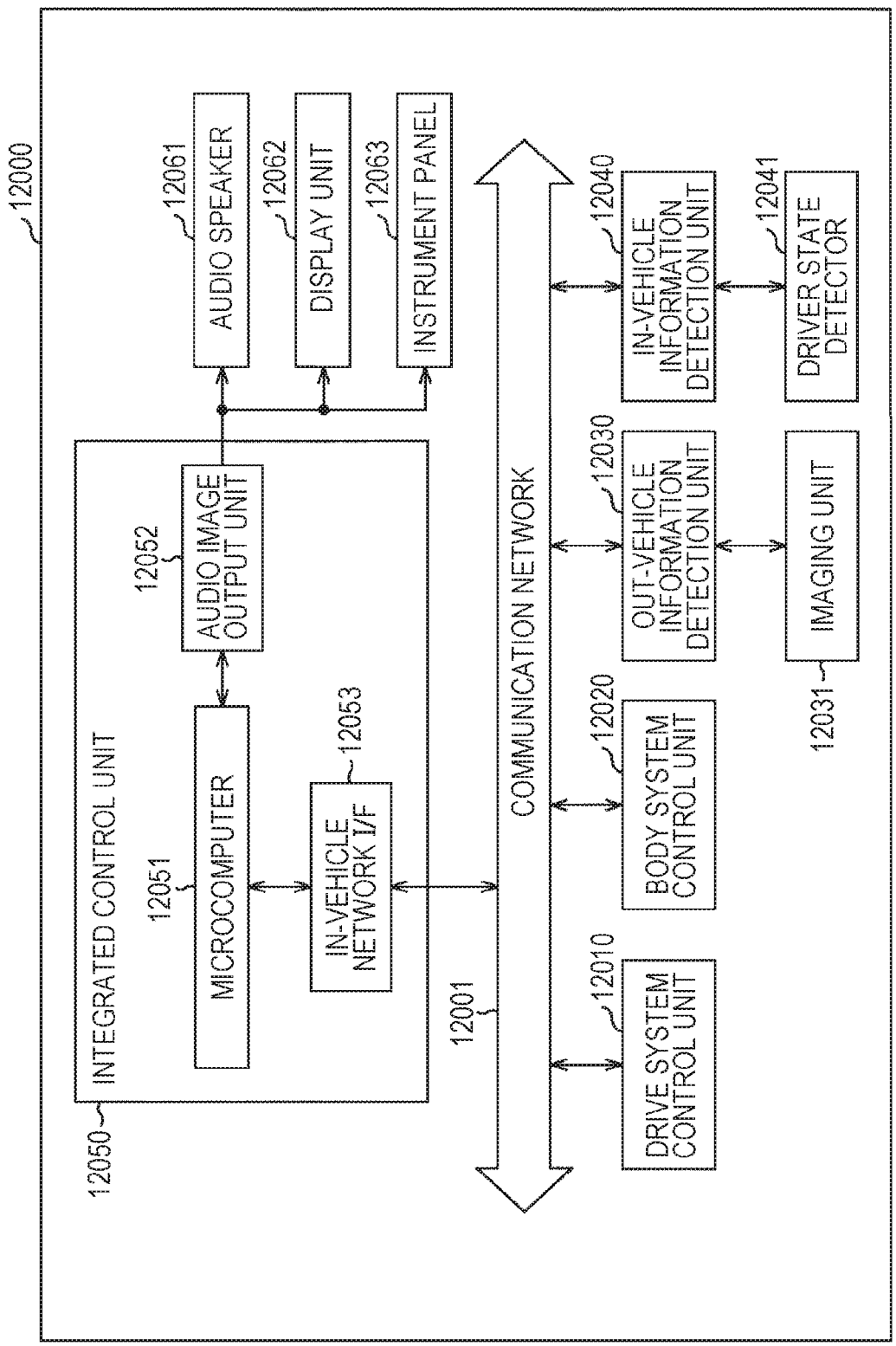
FIG. 18 is a block diagram illustrating a schematic configuration example of a vehicle control system that is an example of a moving body control system to which the technology of the present disclosure can be applied.

FIG. 18 is a block diagram illustrating a schematic configuration example of a vehicle control system that is an example of a moving body control system to which the technology of the present disclosure can be applied.

A vehicle control system 12000 includes a plurality of electronic control units connected via a communication network 12001. In the example illustrated in FIG. 18, the vehicle control system 12000 includes a drive system control unit 12010, a body system control unit 12020, an out-vehicle information detection unit 12030, an in-vehicle information detection unit 12040, and an integrated control unit 12050. Further, a microcomputer 12051, a sound image output unit 12052, and an in-vehicle network interface (I/F) 12053 are illustrated as a functional configuration of the integrated control unit 12050.

The drive system control unit 12010 controls an operation of a device related to the drive system of the vehicle in accordance with various programs. For example, the drive system control unit 12010 functions as a control device for a driving force generator for generating a driving force of a vehicle such as an internal combustion engine and a driving motor, a driving force transmission mechanism for transmitting the driving force to wheels, a steering mechanism for adjusting a steering angle of the vehicle, a brake device for generating a vehicle braking force, etc.

The body system control unit 12020 controls operations of various devices mounted on a vehicle body in accordance with various programs. For example, the body system control unit 12020 functions as a control device for a keyless entry system, a smart key system, a power window device, or various lamps such as a head lamp, a back lamp, a brake lamp, a blinker, and a fog lamp. In this case, radio waves transmitted from a portable device that substitutes for a key or signals from various switches may be input to the body system control unit 12020. The body system control unit 12020 receives input of these radio waves or signals, and controls a door lock device, a power window device, a lamp, etc. of the vehicle.

The out-vehicle information detection unit 12030 detects information outside the vehicle on which the vehicle control system 12000 is mounted. For example, the imaging unit 12031 is connected to the out-vehicle information detection unit 12030.

The out-vehicle information detection unit 12030 causes the imaging unit 12031 to capture an image outside the vehicle and receives the captured image. The out-vehicle information detection unit 12030 may perform object detection processing or distance detection processing of a person, a car, an obstacle, a sign, or a character on a road surface, etc. on the basis of the received image.

The imaging unit 12031 is an optical sensor that receives light and outputs an electrical signal corresponding to the amount of received light. The imaging unit 12031 can output an electrical signal as an image, or can output the electrical signal as distance measurement information. In addition, the light received by the imaging unit 12031 may be visible light or invisible light such as infrared rays.

The in-vehicle information detection unit 12040 detects information inside the vehicle. For example, a driver state detector 12041 that detects a state of the driver is connected to the in-vehicle information detection unit 12040. The driver state detector 12041 includes, for example, a camera that captures an image of the driver, and the in-vehicle information detection unit 12040 may calculate a degree of fatigue or concentration of the driver on the basis of detection information input from the driver state detector 12041, and may determine whether or not the driver is asleep.

The microcomputer 12051 can calculate a control target value of the driving force generator, the steering mechanism, or the brake device on the basis of the information inside or outside the vehicle acquired by the out-vehicle information detection unit 12030 or the in-vehicle information detection unit 12040, and output a control command to the drive system control unit 12010. For example, the microcomputer 12051 can perform cooperative control for the purpose of realizing an advanced driver assistance system (ADAS) function including vehicle collision avoidance or impact mitigation, follow-up travel based on inter-vehicle distance, vehicle speed maintenance travel, vehicle collision warning, vehicle lane departure warning, etc.

In addition, the microcomputer 12051 can perform cooperative control for the purpose of automatic driving, etc. for autonomously traveling without depending on the operation of the driver by controlling the driving force generator, the steering mechanism, the brake device, or the like, on the basis of information around the vehicle acquired by the out-vehicle information detection unit 12030 or the in-vehicle information detection unit 12040.

In addition, the microcomputer 12051 can output a control command to the body system control unit 12020 on the basis of the information outside the vehicle acquired by the out-vehicle information detection unit 12030. For example, the microcomputer 12051 can control the head lamp in accordance with a position of a preceding vehicle or an oncoming vehicle detected by the out-vehicle information detection unit 12030, and perform cooperative control for the purpose of preventing glare such as switching from a high beam to a low beam.

The sound image output unit 12052 transmits an output signal of at least one of sound or image to an output device capable of visually or audibly reporting information to a vehicle occupant or outside the vehicle. In the example of FIG. 18, an audio speaker 12061, a display unit 12062, and an instrument panel 12063 are illustrated as output devices. The display unit 12062 may include, for example, at least one of an on-board display or a head-up display.

Figure 19:
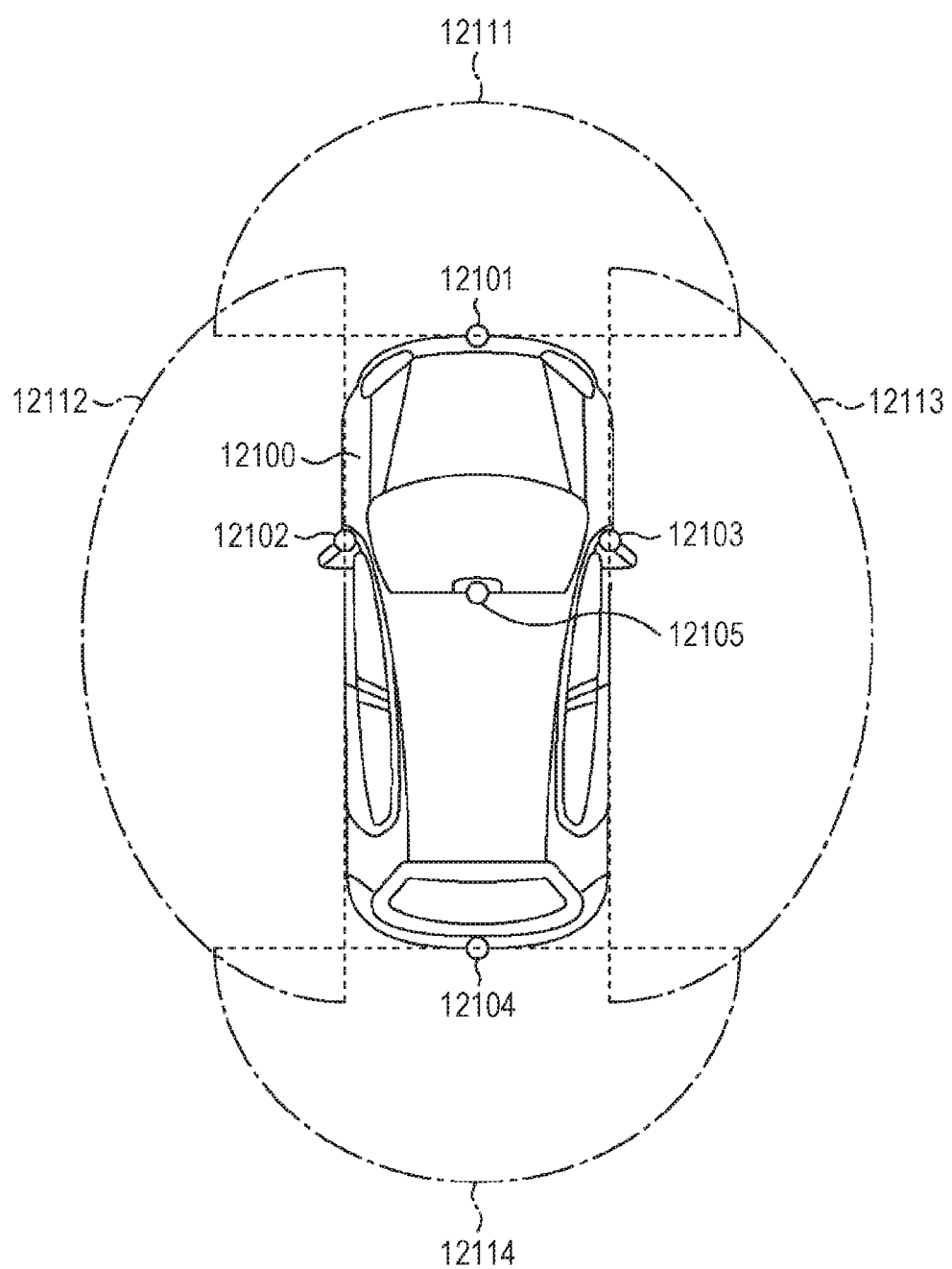
FIG. 19 is a diagram illustrating an example of an installation position of an imaging unit.

FIG. 19 is a diagram illustrating an example of an installation position of the imaging unit 12031.

In FIG. 19, imaging units 12101, 12102, 12103, 12104, and 12105 are included as the imaging unit 12031.

The imaging units 12101, 12102, 12103, 12104, and 12105 are provided, for example, at positions such as a front nose, a side mirror, a rear bumper, a back door, and an upper part of a windshield in a passenger compartment of the vehicle 12100. The imaging unit 12101 provided in the front nose and the imaging unit 12105 provided in the upper part of the windshield in the passenger compartment mainly acquire an image in front of the vehicle 12100. The imaging units 12102 and 12103 provided in the side mirrors mainly acquire an image of the side of the vehicle 12100. The imaging unit 12104 provided in the rear bumper or the back door mainly acquires an image behind the vehicle 12100. The imaging unit 12105 provided in the upper part of the windshield in the passenger compartment is mainly used for detecting a preceding vehicle, a pedestrian, an obstacle, a traffic light, a traffic sign, a lane, etc.

Note that FIG. 17 illustrates an example of imaging ranges of the imaging units 12101 to 12104. An imaging range 12111 indicates the imaging range of the imaging unit 12101 provided in the front nose, imaging ranges 12112 and 12113 indicate the imaging ranges of the imaging units 12102 and 12103 provided in the side mirrors, respectively, and an imaging range 12114 indicates the imaging range of the imaging unit 12104 provided in the rear bumper or the back door. For example, by overlapping image data captured by the imaging units 12101 to 12104, an overhead image of the vehicle 12100 viewed from above is obtained.

At least one of the imaging units 12101 to 12104 may have a function of acquiring distance information. For example, at least one of the imaging units 12101 to 12104 may correspond to a stereo camera including a plurality of image pick-up devices, or correspond to an image pick-up device having a pixel for phase difference detection.

For example, the microcomputer 12051 can extract, as a preceding vehicle, a three-dimensional (3D) object, which is particularly the closest 3D object on a traveling path of the vehicle 12100, traveling at a predetermined speed (for example, 0 km/h or more) in substantially the same direction as that of the vehicle 12100 by obtaining a distance to each 3D object in the imaging ranges 12111 to 12114 and a temporal change of this distance (relative speed with respect to the vehicle 12100) on the basis of the distance information obtained from the imaging units 12101 to 12104. Further, the microcomputer 12051 can set an inter-vehicle distance to be secured in advance before the preceding vehicle, and perform automatic brake control (including follow-up stop control), automatic acceleration control (including follow-up start control), etc. In this way, it is possible to perform cooperative control for the purpose of autonomous driving, etc. for autonomously traveling without depending on the operation of the driver.

For example, the microcomputer 12051 can classify 3D data related to the 3D object into a two-wheeled vehicle, a normal vehicle, a large vehicle, a pedestrian, and other 3D objects such as a utility pole, on the basis of the distance information obtained from the imaging units 12101 to 12104, extract the 3D data, and use the 3D data for automatic avoidance of an obstacle. For example, the microcomputer 12051 distinguishes an obstacle visually recognizable by the driver of the vehicle 12100 and an obstacle difficult to visually recognize from obstacles around the vehicle 12100. Then, the microcomputer 12051 can determine a collision risk indicating a risk of collision with each obstacle. In a situation in which the collision risk is greater than or equal to a set value and there is a possibility of collision, the microcomputer 12051 can perform driving assistance for collision avoidance by outputting an alarm to the driver via the audio speaker 12061 or the display unit 12062, or by performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not the pedestrian is present in the captured images of the imaging units 12101 to 12104. For example, such pedestrian recognition is performed through a procedure for extracting feature points in the captured images of the imaging units 12101 to 12104 as infrared cameras, and a procedure for determining whether or not an object is the pedestrian by performing pattern matching processing on a series of feature points indicating a contour of the object. When the microcomputer 12051 determines that a pedestrian is present in the captured images of the imaging units 12101 to 12104 and recognizes the pedestrian, the sound image output unit 12052 controls the display unit 12062 so that a square outline for emphasis is superimposed on the recognized pedestrian. Further, the sound image output unit 12052 may control the display unit 12062 so as to display an icon, etc. indicating the pedestrian at a desired position.

Heretofore, a description has been given of an example of the vehicle control system to which the technology of the present disclosure can be applied. The technology of the present disclosure can be applied to, for example, the imaging unit 12031 or the driver state detector 12041 in the configurations described above. Specifically, for example, the CMOS image sensor 1 of FIG. 1 can be applied to the imaging unit 12031 or the driver state detector 12041. By applying the technology of the present disclosure to the imaging unit 12031 or the driver state detector 12041, it is possible to shorten one AD time corresponding to a pixel signal reading and analog-digital conversion time for one time, and thus which can contribute to, for example, speeding up an operation of detecting information outside and inside the vehicle.

<Configuration that can be Taken by Present Disclosure>

Note that the present disclosure can take the following configurations.

<<A. Solid-State Image Pick-Up Device>>

[A-1] A solid-state image pick-up device including a pixel array unit obtained by disposing a plurality of unit pixels, each of which includes a photoelectric conversion unit, in a matrix form, an amplifier unit that adjusts a level of a pixel signal output from a unit pixel through a vertical signal line provided to correspond to column arrangement of the pixel array unit, a sample and hold unit that samples and holds a pixel signal passing through the amplifier unit, and an analog-digital conversion unit that converts the pixel signal output from the sample and hold unit into a digital signal, in which the sample and hold unit includes at least three capacitors that hold pixel signals and performs fetching of a pixel signal to one capacitor and outputting of an image signal fetched to another capacitor to the analog-digital conversion unit in parallel.

[A-2] The solid-state image pick-up device according to the item [A-1], in which a stacked structure in which at least two semiconductor substrates of a first semiconductor substrate and a second semiconductor substrate are stacked is formed, the pixel array unit is formed on the first semiconductor substrate, and the sample and hold unit is formed on a semiconductor substrate other than the first semiconductor substrate.

[A-3] The solid-state image pick-up device according to the item [A-1] or the item [A-2], in which the pixel signal includes a reset signal output from a unit pixel during resetting and a data signal output from a unit pixel during photoelectric conversion, and the sample and hold unit includes a total of four capacitors with respect to two pixel signals output from a unit pixel one after another in time series, the four capacitors corresponding to two capacitors for a reset signal and a data signal of one pixel signal and two capacitors for a reset signal and a data signal of the other image signal.

[A-4] The solid-state image pick-up device according to any one of the item [A-1] to the item [A-3], in which the sample and hold unit includes a reset switch that resets a potential of a circuit output terminal that outputs a pixel signal to the analog-digital conversion unit.

[A-5] The solid-state image pick-up device according to any one of the item [A-1] to the item [A-4], in which the amplifier unit includes an adaptive gain type amplifier that adaptively adjusts gain to obtain a constant signal level.

[A-6] The solid-state image pick-up device according to the item [A-5], in which the amplifier unit is allowed to switch between at least two types of gain.

[A-7] The solid-state image pick-up device according to the item [A-6], in which the amplifier unit includes a level determination circuit that determines a level of a pixel signal and switches gain according to a determination result of the level determination circuit.

[A-8] The solid-state image pick-up device according to the item [A-7], further including a digital signal processing unit that processes a digital signal output from the analog-digital conversion unit, in which the digital signal processing unit performs level adjustment on the digital signal on the basis of a determination result of the level determination circuit.

[A-9] The solid-state image pick-up device according to the item [A-8], in which the digital signal processing unit performs compression processing on the digital signal on the basis of a determination result of the level determination circuit.

<<B. Electronic Device>>

[B-1] An electronic device including a solid-state image pick-up device including a pixel array unit obtained by disposing a plurality of unit pixels, each of which includes a photoelectric conversion unit, in a matrix form, an amplifier unit that adjusts a level of a pixel signal output from a unit pixel through a vertical signal line provided to correspond to column arrangement of the pixel array unit, a sample and hold unit that samples and holds a pixel signal passing through the amplifier unit, and an analog-digital conversion unit that converts the pixel signal output from the sample and hold unit into a digital signal, in which the sample and hold unit includes at least three capacitors that hold pixel signals and performs fetching of a pixel signal to one capacitor and outputting of an image signal fetched to another capacitor to the analog-digital conversion unit in parallel.

[B-2] The electronic device according to the item [B-1], in which a stacked structure in which at least two semiconductor substrates of a first semiconductor substrate and a second semiconductor substrate are stacked is formed, the pixel array unit is formed on the first semiconductor substrate, and the sample and hold unit is formed on a semiconductor substrate other than the first semiconductor substrate.

[B-3] The electronic device according to the item [B-1] or the item [B-2], in which the pixel signal includes a reset signal output from a unit pixel during resetting and a data signal output from a unit pixel during photoelectric conversion, and the sample and hold unit includes a total of four capacitors with respect to two pixel signals output from a unit pixel one after another in time series, the four capacitors corresponding to two capacitors for a reset signal and a data signal of one pixel signal and two capacitors for a reset signal and a data signal of the other image signal.

[B-4] The electronic device according to any one of the item [B-1] to the item [B-3], in which the sample and hold unit includes a reset switch that resets a potential of a circuit output terminal that outputs a pixel signal to the analog-digital conversion unit.

[B-5] The electronic device according to any one of the item [B-1] to the item [B-4], in which the amplifier unit includes an adaptive gain type amplifier that adaptively adjusts gain to obtain a constant signal level.

[B-6] The electronic device according to the item [B-5], in which the amplifier unit is allowed to switch between at least two types of gain.

[B-7] The electronic device according to the item [B-6], in which the amplifier unit includes a level determination circuit that determines a level of a pixel signal and switches gain according to a determination result of the level determination circuit.

[B-8] The electronic device according to the item [B-7], further including a digital signal processing unit that processes a digital signal output from the analog-digital conversion unit, in which the digital signal processing unit performs level adjustment on the digital signal on the basis of a determination result of the level determination circuit.

[B-9] The electronic device according to the item [B-8], in which the digital signal processing unit performs compression processing on the digital signal on the basis of a determination result of the level determination circuit.

REFERENCE SIGNS LIST

1 CMOS image sensor (solid-state image pick-up device)
2 Unit pixel
11 Pixel array unit
12 Row selection unit
13 Load MOS unit
14 Column amplifier unit
15 Sample and hold unit
16 Analog-digital conversion unit
17 Memory unit
18 Data processing unit
19 Output unit
20 Timing controller
21 Photodiode (photoelectric conversion unit)
22 Transfer transistor
23 Reset transistor
24 Amplification transistor
25 Selection transistor
31 ($31_1$ to $31_m$) Pixel drive line
32 ($32_1$ to $32_n$) Vertical signal line
151 Sample and hold circuit
161 Analog-digital converter

The invention claimed is:

1. A solid-state image pick-up device, comprising:
an analog-digital conversion unit;
a pixel array unit that includes a plurality of unit pixels in a matrix, wherein
each unit pixel of the plurality of unit pixels includes a photoelectric conversion unit,
the plurality of unit pixels includes a unit pixel configured to output a pixel signal of a plurality of pixel signals through a vertical signal line, and
the vertical signal line corresponds to a column arrangement of the pixel array unit;
an amplifier unit that includes:
an inverting amplifier configured to output a voltage based on the pixel signal;
a plurality of level determination circuits, wherein each level determination circuit of the plurality of level determination circuits is configured to determine a level of the pixel signal based on the output voltage; and
a first output terminal,
wherein the amplifier unit is configured to:
adjust the level of the pixel signal based on the determination of the level of the pixel signal;
output, via the first output terminal, the pixel signal based on the adjustment of the level of the pixel signal; and
a sample and hold unit that includes:
at least three capacitors configured to hold the plurality of pixel signals;
a second output terminal different from the first output terminal; and
a reset switch configured to reset a potential of the second output terminal in the sample and hold unit, wherein
the sample and hold unit is configured to:
receive the pixel signal from the amplifier unit;
sample and hold the received pixel signal;
fetch the received pixel signal to a first capacitor of the at least three capacitors; and
output, via the second output terminal, an image signal fetched to a second capacitor of the at least three capacitors to the analog-digital conversion unit, wherein the received pixel signal is fetched in parallel with the output of the image signal, and
the analog-digital conversion unit is configured to convert, into a digital signal, the image signal output from the second output terminal of the sample and hold unit.

2. The solid-state image pick-up device according to claim 1, further comprising a stacked structure that includes a first semiconductor substrate and a second semiconductor substrate, wherein
the pixel array unit is on the first semiconductor substrate, and
the sample and hold unit is on the second semiconductor substrate.

3. The solid-state image pick-up device according to claim 1, wherein
the pixel signal includes:
a first reset signal output from the unit pixel during a reset operation, and
a first data signal output from the unit pixel during photoelectric conversion, and the sample and hold unit further includes four capacitors with respect to a first pixel signal of the plurality of pixel signals and a second pixel signal of the plurality of pixel signals, the unit pixel is further configured to output the first pixel signal at a first time and the second pixel signal at a second time subsequent to the first time, first two capacitors of the four capacitors correspond to the first reset signal and the first data signal of the pixel signal, and second two capacitors of the four capacitors correspond to a second reset signal and a second data signal of the image signal.

4. The solid-state image pick-up device according to claim 1, wherein the amplifier unit further includes an adaptive gain type amplifier configured to adaptively adjust gain to obtain a constant signal level.

5. The solid-state image pick-up device according to claim 4, wherein the amplifier unit is further configured to switch between at least two types of the gain.

6. The solid-state image pick-up device according to claim 5, wherein the plurality of level determination circuits is configured to
switch between the at least two types of the gain based on the determination of the level.

7. The solid-state image pick-up device according to claim 6, further comprising a digital signal processing unit, wherein
the analog-digital conversion unit is further configured to output the digital signal, and
the digital signal processing unit is configured to:
process the digital signal output from the analog-digital conversion unit; and
execute level adjustment on the digital signal based on the determination of the level.

8. The solid-state image pick-up device according to claim 7, wherein the digital signal processing unit is further configured to execute compression processing on the digital signal based on the determination of the level.

9. An electronic device, comprising:
a solid-state image pick-up device including:
an analog-digital conversion unit;
a pixel array unit that includes a plurality of unit pixels in a matrix, wherein
each unit pixel of the plurality of unit pixels includes a photoelectric conversion unit,
the plurality of unit pixels includes a unit pixel configured to output a pixel signal of a plurality of pixel signals through a vertical signal line, and
the vertical signal line corresponds to a column arrangement of the pixel array unit;
an amplifier unit that includes:
an inverting amplifier configured to output a voltage based on the pixel signal;
a plurality of level determination circuits, wherein each level determination circuit of the plurality of level determination circuits is configured to determine a level of the pixel signal based on the output voltage; and
a first output terminal,
wherein the amplifier unit is configured to:
adjust the level of the pixel signal based on the determination of the level of the pixel signal; and
output, via the first output terminal, the pixel signal based on the adjustment of the level of the pixel signal; and
a sample and hold unit that includes:
at least three capacitors configured to hold the plurality of pixel signals;
a second output terminal different from the first output terminal; and
a reset switch configured to reset a potential of the second output terminal in the sample and hold unit, wherein
the sample and hold unit is configured to:
receive the pixel signal from the amplifier unit;
sample and hold the received pixel signal;
fetch the received pixel signal to a first capacitor of the at least three capacitors; and
output, via the second output terminal, an image signal fetched to a second capacitor of the at least three capacitors to the analog-digital conversion unit, wherein the received pixel signal is fetched in parallel with the output of the image signal, and
the analog-digital conversion unit is configured to convert, into a digital signal, the image signal output from the second output terminal of the sample and hold unit.

* * * * *